(12) United States Patent
Nicholls et al.

(10) Patent No.: US 6,429,748 B2
(45) Date of Patent: *Aug. 6, 2002

(54) OSCILLATION CIRCUITS FEATURING COAXIAL RESONATORS

(75) Inventors: Charles T. Nicholls, Nepean; Johan M. Grundlingh, Kinburn, both of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/732,752

(22) Filed: Dec. 11, 2000

Related U.S. Application Data

(63) Continuation-in-part of application No. 09/409,989, filed on Sep. 30, 1999.

(51) Int. Cl.[7] .............................. H01P 7/04; H01P 7/10; H03B 5/18; H03B 7/14; H03L 7/099

(52) U.S. Cl. ........................ 331/56; 331/34; 331/102; 331/114; 331/115; 331/117 D; 331/177 V; 333/206; 333/219.1; 333/222

(58) Field of Search ............................. 331/34, 56, 96, 331/117 D, 177 V, 101, 102, 114, 115, 116 M, 116 R, 107 C, 107 DP; 333/206, 219.1, 222

(56) References Cited

PUBLICATIONS

G.R. Jossop, Radio Society of Great Britain, VHF UHF Manual, 1990, pp. 5.1–5.3.

*Primary Examiner*—Benny Lee
*Assistant Examiner*—Kimberly E Glenn

(57) ABSTRACT

There is a manufacturing limit on how small ceramic coaxial resonators can be produced, which leads to a limit on the frequency of resonance for these resonators. One technique to double the effective frequency of a ceramic coaxial resonator is to couple each end of a resonator to a Colpitts oscillator, the oscillators being balanced and out-of-phase by 180°. During operation, the resonator is effectively divided in half with a virtual ground forming in the center. This allows a single resonator to operate as two resonators of half the original size. Hence, the oscillation frequency for each of these balanced oscillators is doubled when compared to the frequency of similar oscillators that have separate ceramic coaxial resonators of similar size. If this technique is further implemented within a push-pull design tuned to the third harmonic, the output oscillation frequency becomes six times that of an oscillator using a separate ceramic coaxial resonator of similar size. This technique expands the range of use for a ceramic coaxial resonator so that, if used along side a subharmonically pumped mixer that allows for doubling of the local oscillator frequency, the maximum oscillation frequency is increased ideally to 60 GHz. This frequency range allows ceramic coaxial resonators to be used for high frequency applications such as LMDS.

35 Claims, 14 Drawing Sheets

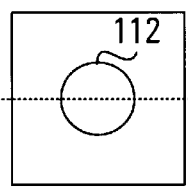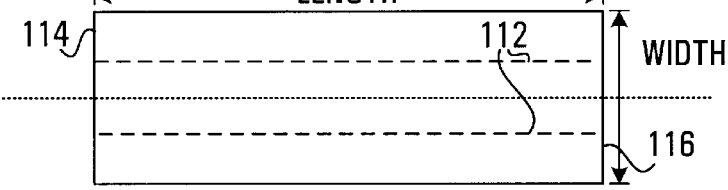
FIG. 6A  FIG. 6B
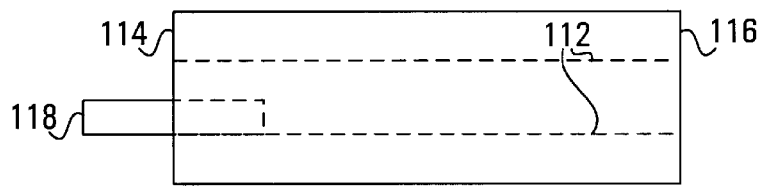
FIG. 6C
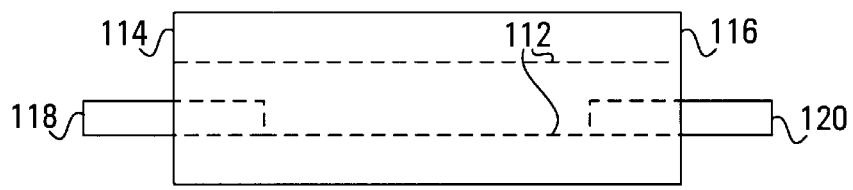
FIG. 6D

OSCILLATION CIRCUITS FEATURING COAXIAL RESONATORS

This application is a Continuation-in-Part of copending application Ser. No. 09/409989 entitled "Coaxial Resonators and Oscillation Circuits Featuring Coaxial Resonators", filed on Sep. 30, 1999 by the inventors of the present application and assigned to the assignee of the present application.

FIELD OF THE INVENTION

This invention relates generally to coaxial resonators and more specifically to modifications within coaxial resonator oscillation circuit designs.

BACKGROUND OF THE INVENTION

Oscillators are required within many different technology areas, especially within the expanding communication industry. In communication applications, oscillators are commonly used to generate carrier signals at specific frequencies on which information signals are subsequently modulated. For instance, a Voltage Controlled Oscillator (VCO) within a Personal Communication System (PCS) would typically be tuned around 1900 MHz.

FIG. 1 is a block diagram illustrating a typical Phase Locked Loop-Frequency Synthesizer (PLL-FS) that is a standard implementation for a VCO within a communication apparatus. In the case shown in FIG. 1, the PLL-FS includes a crystal reference oscillator 20, in this case operating at 8 MHz, coupled in series with a first frequency divider 22, a phase detector 24, a loop filter 26, a VCO in the form of a voltage Controlled-Coaxial Resonator Oscillator (VC-CRO) 28, a coupler 30 that generates a sample of the signal output from the VC-CRO 28, and an amplifier 32 that outputs a signal $S_{OUT}$ (t). Further, the PLL-FS includes a phase feedback path comprising a second frequency divider 36 coupled between the coupler 30 and the phase detector 24.

Within the block diagram of FIG. 1, the crystal reference oscillator 20 outputs a crystal reference signal at 8 MHz that is subsequently frequency divided down to 160 KHz by the first frequency divider 22. The phase detector 24 receives the divided crystal reference signal and compares its phase with a feedback signal, the generation of the feedback signal being described herein below. The output of the phase detector 24 is a baseband signal, the amplitude of which is proportional to the phase difference between the two signals input to the phase detector 24, along with comparison frequency spurs at integer multiples of 160 KHz. The loop filter 26 (that could be either passive or active) receives the output from the phase detector 24 and removes the spurs within the signal by rejecting the components at multiples (nx160 KHz) of the comparison frequency (160 KHz), leaving only the baseband signal. This filtered result is fed as a control voltage into a tuning port 34 of the VC-CRO 28, the frequency of which is controlled with a varactor diode arrangement (not shown). The VC-CRO 28 in this case comprises a Colpitts oscillator stabilized with a ceramic coaxial resonator that creates a signal at an oscillation frequency based upon the frequency of resonance of the particular resonator used and the control voltage applied at the tuning port 34. The oscillation frequency is normally slightly less than that of the frequency of resonance (typically between 200 MHz and 5 GHz). The high frequency signal output from the VC-CRO 28 is sampled by the coupler 30 and frequency divided by the second frequency divider 36 to generate the feedback signal input to the phase detector 24. One should understand that the amount the frequency of the feedback signal is divided within the second frequency divider 36 determines the control voltage output from the phase detector 26. This voltage level subsequently determines the oscillation frequency at which the VC-CRO 28 is tuned, with changes in the division factor allowing for step changes in the oscillation frequency. As depicted in FIG. 1, the output from the VC-CRO 28 is received at the amplifier 32 which amplifies the signal and outputs the amplified result as the signal $S_{OUT}$ (t). Overall, the PLL synthesizer architecture enables digital control over the VC-CRO frequency, and also locks the VC-CRO to the reference crystal oscillator which ensures the frequency stability of the source over all system conditions such as temperature, ageing, and mechanical stress.

There are a number of advantages of using a ceramic coaxial resonator to stabilize a VC-CRO within a PLL-FS. These advantages relate to the physical design of a ceramic coaxial resonator. Typically, a ceramic coaxial resonator comprises a ceramic dielectric material formed as a rectangular prism with a coaxial hole running lengthwise through the prism and a electrical connector connected to one end. The outer and inner surfaces of the prism, with the exception of the end connected to the electrical connector and possibly the opposite end, are coated in a metal such as copper or silver. A device formed in this manner essentially forms a resonant RF circuit, including capacitance, inductance, and resistance, that oscillates when in the Transverse Electromagnetic (TEM) mode (as is the case when stabilizing a Colpitts oscillator). The advantages gained with this design include a high Q value (typically approx 800) and therefore low noise oscillations associated with the resonator as well as temperature stability and resistance to microphonics that characterize a ceramic coaxial resonator. These advantages result in a further important advantage, that being a low cost; currently approximately 65 cents per resonator.

Unfortunately, there is a significant problem with the use of ceramic coaxial resonators as currently designed. The frequency of resonance for a ceramic coaxial resonator has a maximum frequency that can be output due to physical limitations. The frequency of resonance for a ceramic coaxial resonator is based upon the physical size and shape of the particular resonator. Generally, the smaller the size of the resonator, the higher is the frequency of resonance and vice versa. The problem is that ceramic coaxial resonators have a minimum size at which they can be manufactured that limits the frequency of resonance equal to or below a maximum value. This is a physical limit that, as currently designed, limits the output of a typical Coaxial Resonator Oscillator (CRO) using a ceramic coaxial resonator to approximately 5 GHz, whether the CRO is voltage controlled or not.

Up until recently, this 5 GHz limit has not significantly affected the use of ceramic coaxial resonators within VC-CROs or CROs since the frequency of operation of previous communication equipment was typically below this level. For example, PCS equipment operate at approximately 1900 MHz. Currently there are a number of different communication standards that require VCOs with oscillation frequencies higher than 5 GHz. For instance, OC-192 fiber optic signals are transmitted at approximately 10 GHz and the newly developed Local Multi-point Distribution System (LMDS), slated to be used for the Internet over wireless, is set to operate between 28 to 30 GHz. It can be assumed that further developments and standards will be designed that require yet higher oscillation frequencies.

One well-known technique to increase the oscillation frequency of signals within a system using a standard VCO as depicted in FIG. 1 is to use a subharmonically pumped mixer that doubles the oscillation frequency at a stage after the VCO. Unfortunately, even with the use of a subharmonically pumped mixer, a system using the standard VCO that operates with a ceramic coaxial resonator is still limited to a maximum oscillation frequency of 10 GHz which is insufficient for LMDS applications. Hence, techniques are required to increase the oscillation frequency within the actual VCOS.

One technique that has been tried to increase the oscillation frequency output from a PLL-FS as depicted in FIG. 1 beyond the 5 GHz limit is to add a frequency multiplication stage after the amplifier 32. An example of such a multiplication stage is illustrated within FIG. 2. As can be seen, a frequency multiplier 38 is coupled to the output of the amplifier 32 and further coupled in series with a first filter 40, an amplifier 42, and a second filter 44. In this design, the multiplier 38 increases the oscillation frequency of the signal by three times that of the frequency output from the amplifier 32. Hence, if the original frequency of the VCO was 5 GHz, this would allow the resulting system frequency (after using a subharmonically pumped mixer) to be 30 GHz. The filters 40, 44 and amplifier 42 are used to reduce the noise spurs and other undesirable characteristics added to the signal as a result of the multiplier 38. One problem with this implementation is the inability of the filters 40, 44 and amplifier 42 to completely remove the spurs and undesired mixing products output from the multiplier 38, hence passing on these non-ideal characteristics to further components within the system that use the oscillating signal. Another problem is the typically low efficiency of multipliers, such as multiplier 38, that can lead to high current consumption within the circuit by the multiplier 38. Yet further, the added components 38, 40, 42, 44 also add to the component count and cost for the overall PLL-FS.

Another technique that is used to increase the oscillation frequency being output from a VCO is to replace the standard VC-CRO 28 with an oscillator stabilized with an alternative resonate device to the ceramic coaxial resonator. In one implementation, this alternate oscillator is a Dielectric Resonator Oscillator (DRO) which can allow for frequencies higher than 20 GHz to be output. A DRO typically continues to use a Colpitts oscillator while using a dielectric resonator in place of the ceramic coaxial resonator. Dielectric resonators consist of a puck of dielectric material encased within a cavity. The physical dimensions of the puck set the frequency range for a DRO while the placement of the puck within the cavity is critical to the tuning of the center frequency. One of the key disadvantages of the DRO implementation is the cost of tuning the center frequency. Since the puck of a DRO is sensitive with respect to its location within the cavity, the DRO as a whole is susceptible to microphonics, that being mechanical vibration of the resonator housing. Although the cost of actual parts used in a DRO are low, the possible problems associated with microphonics and frequency centering adds considerable manufacturing costs to a DRO as specially engineered casings are required. This results in a DRO currently costing approximately $500–600. On the other hand, a well-known CRO as described herein above can cost less than $10.

Another alternative implementation for the VCO within FIG. 1 is to replace the VC-CRO 28 stabilized with a ceramic coaxial resonator with a Yttrium Ion Garnet (YIG) stabilized oscillator. These oscillators can operate at sufficiently high frequencies with low noise throughout the tuning bandwidth. Unfortunately, there are a number of unacceptable disadvantages to their use. For one, the tuning of these YIG devices is relatively slow (300 KHz modulation bandwidth versus a typical 2 MHz modulation bandwidth for a VC-CRO) due to the use of an inductor within the tuned circuit. Other disadvantages include the high current consumption of these oscillators and their relatively high cost when compared to the VC-CRO. A minimum cost for a YIG stabilized oscillator is approximately $90. Due to these problems, YIG stabilized oscillators are used seldom in industry except within measurement equipment.

The advantages of using a ceramic coaxial resonator to stabilize an oscillator within a PLL frequency synthesizer are especially apparent when compared to the alternative designs discussed above. The simple design of a ceramic coaxial resonator is not sensitive to microphonics as there are no placement or cavity requirement, unlike the dielectric resonator implementation. Further, the tuning of a VC-CRO is sufficiently fast to be used within a variety of applications, unlike the tuning of a YIG stabilized oscillator. A key advantage, as a result of the other advantages, is the high performance quality with a low cost. The disadvantage is, as discussed previously, the physical limitation to the size of a ceramic resonator that further causes a limitation to the achievable oscillation frequency.

Another significant limitation to the overall design of a CRO concerns the components used within the PLL-FS, as will be described herein below. Although the block diagrams of FIGS. 1 and 2 accurately depict typical block diagrams for PLL-FS designs, in reality, PLL-FS designs normally have the first frequency divider 22, the phase detector 24 and at least a portion of the second frequency divider 36 combined within a single component, hereinafter referred to as a PLL synthesizer chip. FIG. 3 illustrates a modified block diagram of FIG. 1 for the case that a PLL synthesizer chip 45 incorporates the first frequency divider 22, the phase detector 24 and an internal frequency divider 46. In this case, the second frequency divider 36 is the combination of the internal frequency divider 46 and an external frequency divider 47 coupled between the coupler 30 and the internal frequency divider 46. The main input/outputs for this synthesizer PLL chip 45 include a reference input from the crystal oscillator 20, a feedback input from the external frequency divider 47 and an output to the filter loop 26.

One significant problem for the overall PLL-FS design of FIG. 3 results from the frequency operating parameters with relation to the feedback input of the PLL synthesizer chip 45, this operating parameter setting a maximum frequency level for the feedback input. Currently, this maximum frequency level is limited to approximately 2.8 GHz. In the next couple of years, this value is expected to increase to such values as 4.0 or 6.0 GHz due to advancements in technology. Unfortunately, in traditional designs, this limitation restricts the output frequency of the CRO 28 unless a frequency divider, like the external frequency divider 47, is implemented between the CRO 28 and the PLL synthesizer chip 45. The difficulties with using external frequency dividers include the resulting increases in divider phase noise floor, cost and physical size for the overall PLL-FS. The increased divider phase noise is particularly troubling due to the external frequency divider being implemented within the feedback path, where the PLL-FS is particularly sensitive to phase noise.

Hence, an alternative implementation for a VCO is required that can satisfy high oscillation frequency requirements while maintaining the advantages gained with the use of ceramic coaxial resonators. Preferably, such a design would further compensate for the limitations within the PLL synthesizer chips so that external frequency dividers would not be necessary.

SUMMARY OF THE INVENTION

The present invention is a new configuration for an oscillator design that utilizes a single coaxial resonator for two CROs. Typically, these two CROs would utilize two separate coaxial resonators. In the present invention, rather than using two separate coaxial resonators, the present invention uses a single coaxial resonator with an electrical connector attached on both ends for coupling the ends to the respective oscillators. This results in the resonator being driven into differential mode, essentially creating a virtual ground in the middle of the resonator between the connectors. With the oscillator design of the present invention, the virtual ground generated in the middle of the resonator effectively divides the resonator device in half, doubling the possible resonance frequency for each half of the resonator. Further, the present invention utilizes a push-pull oscillator design to further triple the oscillation frequency generated by the CRO circuit. Thus, the range of use for the advantageous ceramic coaxial resonator can be expanded six fold with the use of this invention.

The present invention, according to a first broad aspect, is an oscillation circuit consisting of a coaxial resonator, first and second negative resistance cells coupled to first and second ends of the coaxial resonator respectively and a combination circuit coupled to each of the first and second negative resistance cells. The combination circuit preferably being a resonant network consisting of reactive components tuned to a required output frequency and driven by outputs from both negative resistance cell. The first and second negative resistance cells are out-of-phase by a phase angle approximately 180 degrees and generate respective first and second oscillation signals at a frequency approximately equal to a self-resonant frequency associated with another coaxial resonator half the size of the coaxial resonator. The combination circuit operates in differential mode to combine the first and second oscillation signals in order to generate an output oscillation signal.

In embodiments of the present invention, the combination circuit is tuned to an odd harmonic of the oscillation frequency of the first and second oscillation signals so as to mitigate the other odd harmonics within the output oscillation signal. In one preferable embodiment, the combination circuit is tuned to the third harmonic of the oscillation frequency of the first and second oscillation signals. In this case, the output oscillation signal has an oscillation frequency approximately six times that of a self resonant frequency of a single resonator operated in an unbalanced oscillator.

In further embodiments of the present invention, the combination circuit includes a resonant load inductor and a tuning capacitor coupled in parallel between first and second nodes that receive the first and second oscillation signals respectively from the first and second negative resistance cells respectively. In some embodiments, the combination circuit further includes an output terminal coupled via a coupling capacitor to one of the first and second nodes and a Radio Frequency (RF) choke inductor coupled between the center of the resonant load inductor and a power rail. In other embodiments, the combination circuit further includes a transformer inductor coupled electro-magnetically to the resonant load inductor and further coupled between an output terminal and a second load connected to ground, the second load being of equal value to the load on the output terminal.

In yet further embodiments of the present invention, the oscillation circuit further includes a frequency adjustment apparatus coupled to the first and second ends of the coaxial resonator, the frequency adjustment apparatus operating to receive a tuning signal and to adjust the load being applied to the coaxial resonator. In preferred embodiments, coupling capacitors are inserted between the first and second ends of the resonator and the frequency adjustment apparatus.

According to a second broad aspect, the present invention is an oscillation circuit consisting of a coaxial resonator with first and second electrical connectors coupled at respective first and second opposite ends of the coaxial resonator, first and second coupling capacitors coupled between the first and second electrical connectors respectively and first and second coupling nodes respectively, first and second negative resistance cells coupled to the first and second coupling nodes respectively and a frequency adjustment apparatus coupled to each of the first and second coupling nodes. In this aspect, the first and second negative resistance cells are out-of-phase by a phase angle approximately 180 degrees and the frequency adjustment apparatus operate to receive a tuning signal and to adjust the load being applied to the coaxial resonator.

According to another broad aspect, the present invention is a Phase Locked Loop-Frequency Synthesizer (PLL-FS) that includes the oscillation circuit of the first broad aspect. Preferably, this synthesizer further comprises a crystal resonator, a Phase Locked Loop (PLL) synthesizer component, an amplifier, and an active or passive loop filter. Preferably, no frequency divider beyond what is included within the PLL synthesizer component is required.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The preferred embodiment of the present invention is described with reference to the following figures, in which:

FIGS. 6A and 6B are detailed diagrams illustrating respective cross-sectional and longitudinal views of a ceramic coaxial resonator;

FIGS. 6C and 6D are detailed diagrams illustrating longitudinal views of the ceramic resonator of FIGS. 6A and 6B with respectively a well-known single connector configuration and a double connector configuration according to a preferred embodiment of the present invention;

DETAILED DESCRIPTION OF THE PREFERRED EMBODIMENTS

Embodiments of the present invention are directed to oscillator designs that allow for high oscillation frequencies while continuing to utilize ceramic coaxial resonators to stabilize the oscillators; hence, maintaining the benefits associated with these resonators. These oscillator designs preferably are such that when replacing the well-known VC-CRO 28 within FIG. 1, the PLL-FS of FIG. 1 can be used for high frequency applications such as LMDS applications, In exemplary embodiments, the use of the oscillator designs does not require frequency dividers to lower the frequency being input to the PLL synthesizer chip or multipliers to raise the oscillation frequency to the LMDS target frequencies.

The oscillator designs, illustrated in FIGS. 5A, 5B and 7A through 7D compensate for the minimum size requirement associated with ceramic coaxial resonators by using a single resonator with an electrical connector on either end to stabilize two apparatuses that appear in operation to have negative resistances, hereinafter referred to as negative resistance cells. Essentially, as will be described herein below in detail, this effectively results in a dividing of the ceramic coaxial resonator into two resonators while in operation. Hence, the resonator operates as two resonators half the size of the single resonator, resulting in a doubling of the frequency of resonance when compared to the typical self resonant frequency generated with a single ceramic coaxial resonator, to be referred to hereinafter as the self resonant frequency of a single resonator.

To aid in the explanation concerning the operation of the oscillators according to embodiments of the present invention, the operation of a typical oscillator with a single negative resistance cell and a single coaxial resonator will first be described in detail with reference to FIG. 4. In this case, the negative resistance cell is in a Colpitts design. Subsequently, descriptions of oscillators that have more than one oscillator using a single resonator will be described with reference to FIGS. 5A, 5B and the embodiments of the present invention of FIGS. 7A through 7D.

Figure 4:
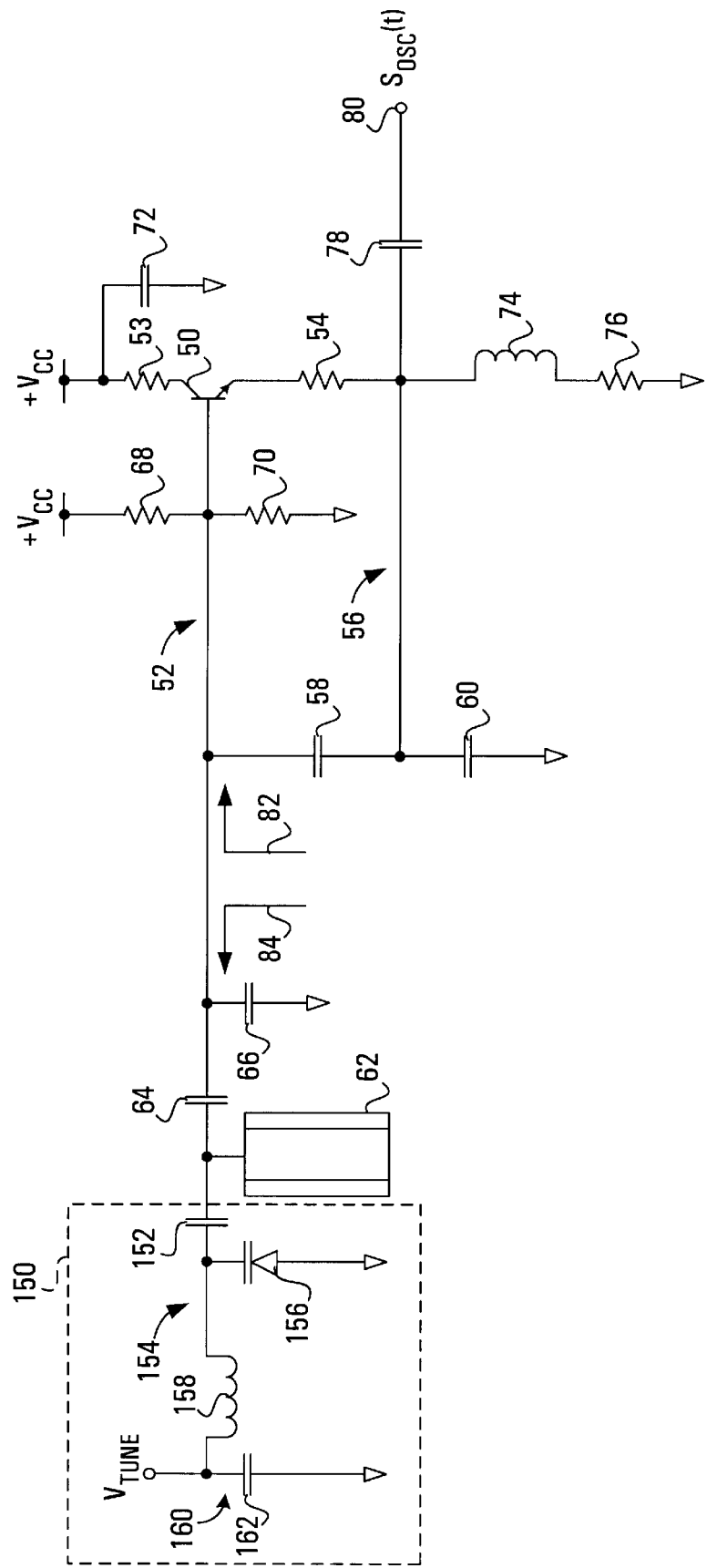
FIG. 4 is a detailed schematic diagram illustrating a well-known Colpitts oscillator using a ceramic coaxial resonator.

FIG. 4 illustrates a schematic diagram of a VC-CRO comprising a negative resistance cell of the Colpitts type that is stabilized with use of a ceramic coaxial resonator. As can be seen within FIG. 4, the VC-CRO comprises a transistor 50 having a collector coupled to a power rail ($V_{CC}$) via an impedance controlling resistor 53, a base coupled to a node 52, and an emitter coupled to a node 56 via a noise suppression resistor 54. The impedance controlling resistor 53 maintains a controlled impedance on the collector of the transistor 50. The noise suppression resistor 54 increases the linearity of the transconductance corresponding to the transistor 50 by reducing the up conversion of baseband flicker noise present in the transistor 50, but also reduces the transistor's gain.

Also coupled to the node 56 is a first feedback capacitor 58 coupled between the nodes 52 and 56 and a second feedback capacitor 60 coupled between the node 56 and ground, which together operate to produce a capacitor divider that determines the loop gain for the oscillator. It should be recognized that the transistor 50 and capacitors 58, 60 in operation comprise the basic components required within a negative resistance cell of the Colpitts type.

Further included within the negative resistance cell of FIG. 4 is a first biasing resistor 68 coupled between the node 52 and the power rail, a second biasing resistor 70 coupled between the node 52 and ground, a capacitor 72 coupled between the collector of transistor 50 and ground, a choke inductor 74 coupled to the node 56, a resistor 76 coupled between the choke inductor 74 and ground, and a coupling capacitor 78 coupled between the node 56 and an output terminal 80 for the circuit. The first and second biasing resistors 68, 70 are used to maintain a biasing voltage at the base of the transistor 50. The capacitor 72 operates to ensure the power rail ($V_{CC}$) appears as a short circuit in terms of the RF spectrum. The resistor 76 sets the dc bias level while the choke inductor 74 essentially removes the resistor 76 from the circuit in terms of the RF spectrum. Overall, it should be recognized that the devices 68, 70, 53, 54, 72, 74, 76 aid in the proper operation of the transistor 50 and capacitors 58, 60.

Also coupled to the node 52 is a ceramic coaxial resonator 62 and a frequency adjustment apparatus 150, via a coupling capacitor 64, and a phase noise optimization capacitor 66 coupled between the node 52 and ground. The coupling capacitor 64 operates to align the impedance locus of the resonator 62 at resonance with that of the impedance in the remainder of the oscillator. The frequency adjustment apparatus, as described herein below, controls the tuning of the oscillation frequency for the overall circuit.

There are two conditions that must be met for the circuit depicted in FIG. 4 to oscillate. Firstly, the overall loop gain of the feedback path for the transistor 50, comprising capacitors 58, 60, resistor 54, the losses corresponding to the resonator 62, and the load on output node 80 must be greater than unity. Secondly, a first reactance looking from arrow 82 must be the complex conjugate of a second reactance looking from arrow 84. This constraint indicates that the reactance resulting from the ceramic coaxial resonator 62 and capacitors 64, 66 must be the complex conjugate of the reactance resulting from the transistor 50 and capacitors 58, 60 (the negative resistance cell). Since the reactance of these devices change with frequency, the oscillation frequency will occur when the frequency versus reactance characteristics of the first and second reactance are equal and opposite. Since the reactance of the transistor 50 fluctuates as a function of the transistor noise, the slope of the source frequency versus reactance characteristic for the resonator 62 (this slope representing the Q value for the resonator) should be high in order to reduce the effect the fluctuations of reactance within the transistor 50 have on the oscillation frequency for the overall circuit.

As mentioned previously, the VC-CRO of FIG. 4 includes the frequency adjustment apparatus 150 that is used to adjust the oscillation frequency for the circuit. In the case shown in FIG. 4, the frequency adjustment apparatus 150 comprises a coupling capacitor 152 coupled between the electrical connector of the resonator 62 and a node 154, a varactor diode 156 with its cathode coupled to the node 154 and its anode coupled to ground, a choke inductor 158 coupled between the node 154 and a node 160, and a capacitor 162 coupled between the node 160 and ground. In this set-up, if a positive tuning voltage ($V_{TUNE}$) is applied to the node 160, the diode 156 becomes reverse biased. This reverse biasing results in an increase in the depletion region of the device which in turn results in a decrease in the capacitance of the diode 156.

Since the varactor diode is coupled to the resonator 62 via the coupling capacitor 152, the adjustment in the capacitance of the diode allows for the regulating of the load on the resonator 62. Overall, by changing the tuning voltage ($V_{TUNE}$), it is possible to adjust the load impedance on the resonator 62 which directly changes the frequency of oscillation.

It is noted that without the frequency adjustment apparatus 150, the VC-CRO of FIG. 4 would not be voltage controlled. It also should be understood that other VC-CRO implementations may use other varactor diode configurations or completely different techniques to adjust the oscillation frequency of the VC-CRO.

As discussed herein above, the oscillation frequency corresponding to the VC-CRO of FIG. 4 is limited to less than or equal to 5 GHz due to physical constraints on the ceramic coaxial resonator 62.

Figure 5A:
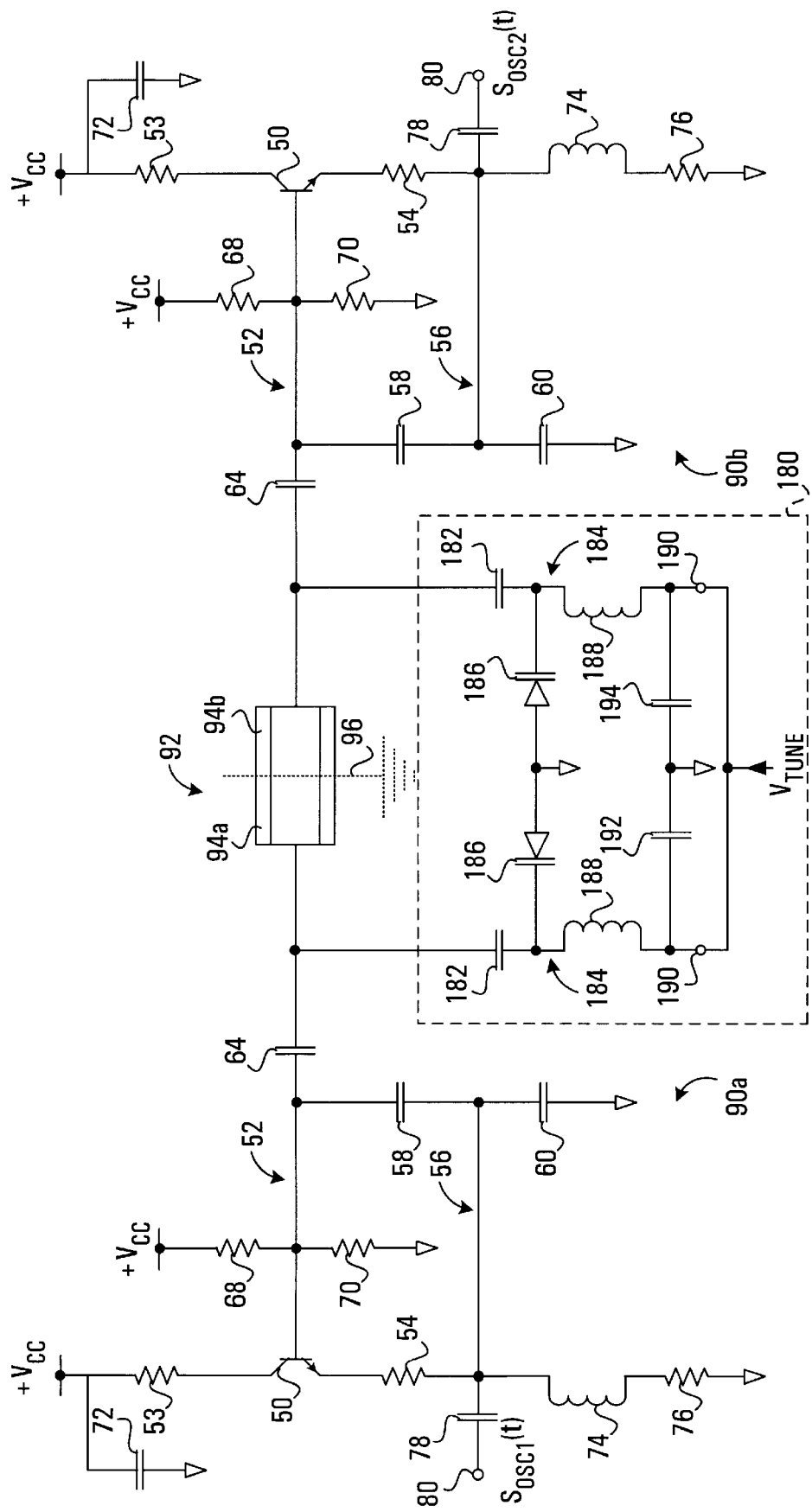
FIG. 5A is a schematic diagram illustrating a balanced oscillator utilizing a single resonator.

FIG. 5A illustrates a schematic diagram of an oscillator design that utilizes a single resonator for two balanced oscillators. In this implementation, the oscillator design comprises first and second negative resistance cells 90a, 90b, in this case each being of the Colpitts oscillator type, that are coupled to electrical connectors at opposite ends of a single coaxial resonator 92, in this case a ceramic coaxial resonator. These first and second negative resistance cells 90a, 90b combined with the resonator 92 create first and second oscillators respectively that output first and second oscillation signals $S_{OSC1}$ (t), $S_{OSC2}$ (t).

Each of these negative resistance cells 90a, 90b in FIG. 5A is identical to the negative resistance cell depicted in FIG. 4. Effectively, the components within these negative resistance cells operate in similar fashion to those previously described for the well-known negative resistance cell of FIG. 4.

In FIG. 5A, the first and second negative resistance cells 90a, 90b of FIG. 5A are balanced so that they operate in anti-phase, i.e. operating at the same frequency but approximately 1800 out-of-phase. This means that the current traversing node 52 within the first negative resistance cell 90a will be increasing when the current traversing node 52 within the second negative resistance cell 90b is decreasing, and vice versa. This anti-phase operation within the two negative resistance cells results in the ceramic coaxial resonator 92 operating in a differential mode. This differential mode operation effectively divides the resonator 92 into first and second halves 94a, 94b by the creation of a virtual ground 96 in the center of the resonator 92.

The division of the ceramic coaxial resonator 92 into two halves 94a, 94b during operation reduces the effective length by half of the resonator that is stabilizing each negative resistance cell 90a, 90b. Since the physical size of a ceramic coaxial resonator is inversely proportional to the frequency of resonance, the end result is a doubling of the oscillation frequency within the first and second oscillators. Hence, the resulting oscillation signals $S_{OSC1}$ (t), $S_{OSC2}$ (t) at the output terminals 80 of the first and second oscillators respectively have an oscillation frequency approximately twice the frequency of resonance normally achieved with the resonator 92 if implemented within the VC-CRO of FIG. 4.

One modification between the CRO of FIG. 4 and the particular implementation of the first and second oscillators depicted within FIG. 5A is the removal of capacitor 66. When the oscillation frequency is doubled using the present invention, the loss due to the capacitor 66 will increase. Although this capacitor 66 can increase the Q value for the resonator 92 if coupled between the node 52 and ground, it is not included in the design depicted in FIG. 5A due to the reduction in loop gain that the capacitor creates at high frequencies. Alternatively, a capacitor is included between the node 52 and ground within both the first and second oscillators. The losses due to the capacitors could be deemed acceptable in these alternative implementations due to the particular design parameters, the characteristics of the devices used, and/or due to the oscillators being operated at lower frequencies.

It is noted that similar to FIG. 4, the first and second oscillators within FIG. 5A are voltage controlled oscillators. As depicted in FIG. 5A, a frequency adjustment apparatus 180 is coupled to both electrical conductors of the resonator 92. This frequency adjustment apparatus 180 preferably consists of two of the frequency adjustment apparatuses 150 depicted within FIG. 4 with a common tuning voltage ($V_{TUNE}$). As depicted in FIG. 5A, the frequency adjustment apparatus 180 comprises, for both halves 94a, 94b of the resonator 92, a coupling capacitor 182 coupled between one of the electrical connectors of the resonator 92 and a node 184; a varactor diode 186 with its cathode coupled to the node 184 and its anode coupled to ground; a choke inductor 188 coupled between the node 184 and a node 190; and a decoupling capacitor 192 coupled between the node 190 and ground. The coupling capacitors 182 operate to reduce any losses at the varactor diodes 186 from loading the resonator 92 while the decoupling capacitors 192 operate to decouple the tuning voltage ($V_{TUNE}$) at low frequencies in order to suppress noise on the tuning signal. In this implementation, similar to that described above for the apparatus 150, a positive tuning voltage ($V_{TUNE}$) will result in both diodes being reverse biased. This in turn will result in an increase in their corresponding depletion regions and a decrease in their capacitance. Hence, the tuning voltage $V_{TUNE}$ can regulate the loading of both sides of the resonator 92 and ultimately control the oscillation frequencies corresponding to the first and second oscillators. In this implementation, the oscillation frequencies for the first and second oscillators track each other since there is a common tuning voltage. In alternative implementations, other well-known techniques to adjust the frequency of an oscillator with an applied voltage could be utilized within FIG. 5A in place of the frequency adjustment apparatus 180.

Figure 5B:
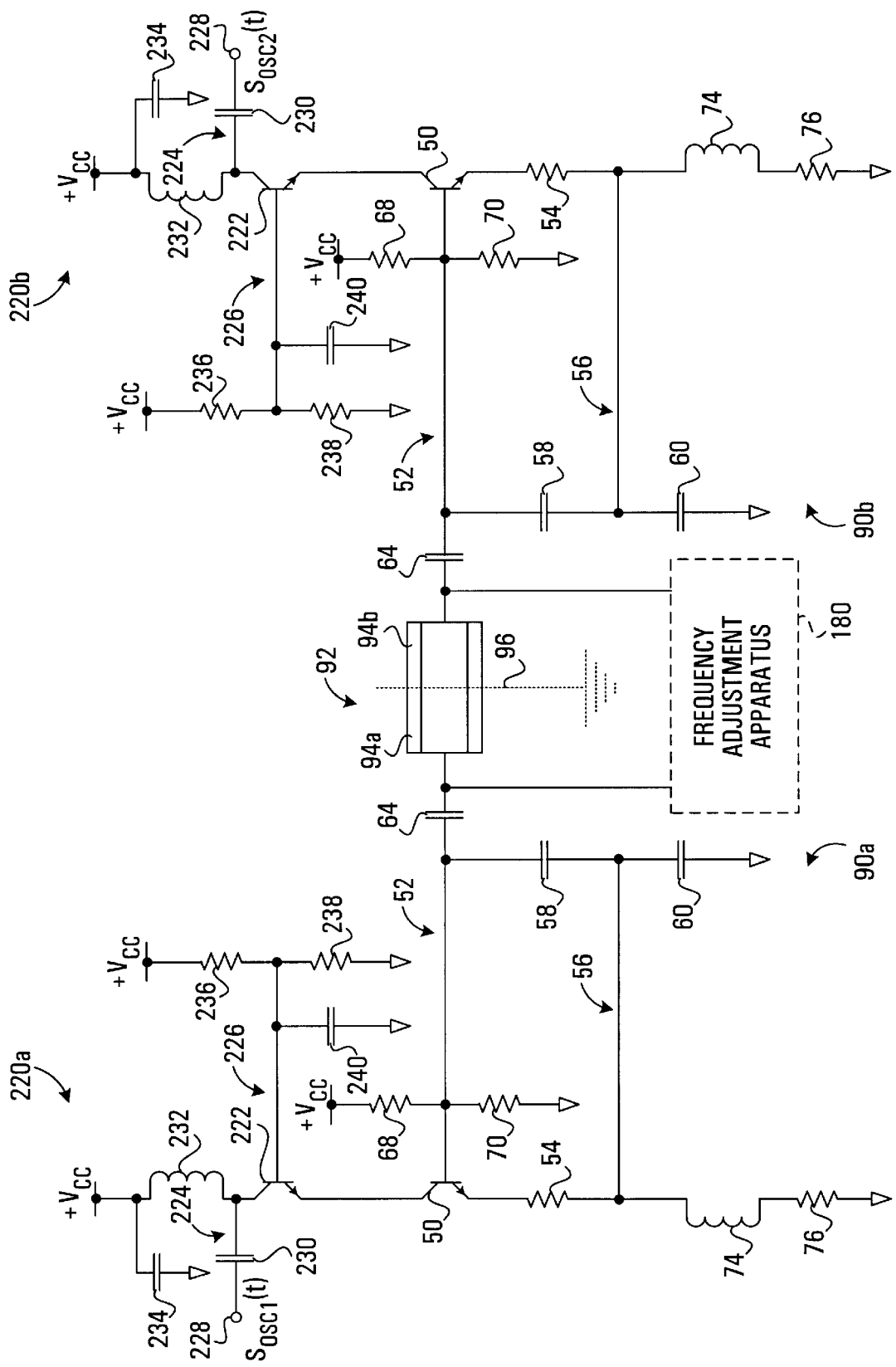
FIG. 5B is the schematic diagram of FIG. 5A with an additional cascode transistor configuration.

Although the output terminals are coupled to the nodes 56, which are low impedance nodes, within the oscillator design depicted within FIG. 5A, it should be recognized that there are other possible output terminal locations. For instance, the outputs of the first and second oscillators could be at the collectors of the transistors 50. Further, the output stage for these oscillators could comprise a cascode implementation as is illustrated within FIG. 5B with cascode apparatuses 220a, 220b coupled to the collectors of the transistors 50 within the first and second oscillators respectively. These cascode apparatuses, in this case, each comprise a transistor 222 with a collector coupled to a node 224, a base coupled to a node 226, and an emitter coupled to the collector of the corresponding transistor 50. Within FIG. 5B, the node 224 is further coupled to an output terminal 228 via a coupling capacitor 230 and a choke inductor 232 that is coupled between the node 224 and a node coupled to the power rail and a grounded capacitor 234. The node 226 is further coupled to a first biasing resistor 236 coupled between the power rail and the node 226, a second biasing resistor 238 coupled between the node 226 and ground, and a grounded capacitor 240. Cascode apparatuses, such as the apparatuses 220a, 220b within FIG. 5B, are used to provide a low impedance at the collector of their respective transistors 50 as well as boost the signal voltage power of their respective output oscillation signals $S_{OSC1}$ (t), $S_{OSC2}$ (t), in some cases replacing the need for a further amplifying stage. The cascode stage also isolates the resultant oscillation frequency from output load variations.

Figure 1:
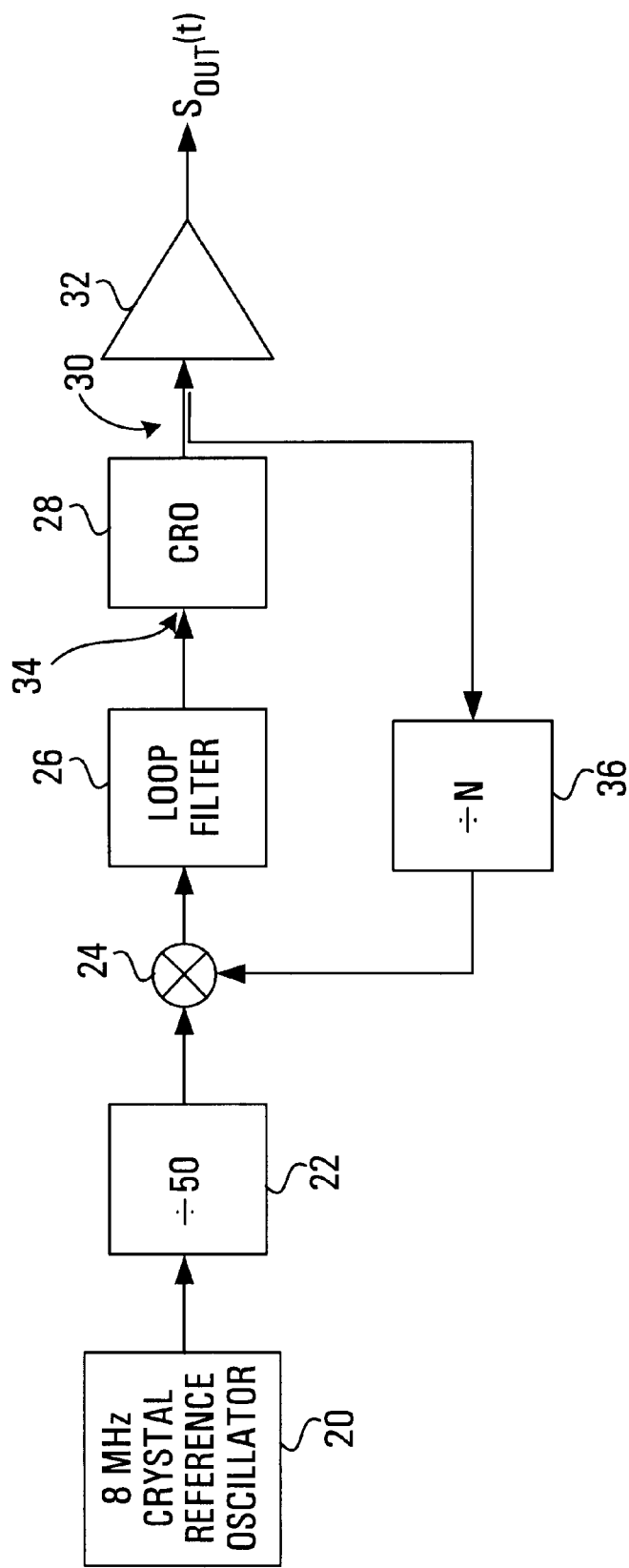
FIG. 1 is a block diagram illustrating a well-known Phase Locked Loop-Frequency Synthesizer (PLL-FS) configuration.

It should be understood that the oscillator design depicted in FIG. 5A or 5B could replace the standard VC-CRO depicted in FIG. 4 within the PLL-FS of FIG. 1. This change effectively doubles the oscillation frequency of the PLL-FS without the need for doublers and/or filters. At most the amplifier 32 depicted in FIG. 1 and/or a cascode stage as depicted in FIG. 5B is required to increase the output power level after the VC-CRO of FIG. 5A.

FIGS. 6A and 6B illustrate cross-sectional and longitudinal views 108, 110 respectively of a typical ceramic coaxial resonator with no electrical connectors attached. The resonator depicted in FIGS. 6A and 6B is a rectangular prism of ceramic dielectric material with a hole 112, in this case a circular hole, running longitudinally through it. This resonator includes first and second ends 114, 116 in which the openings of the hole 112 are located, as well as four other outside longitudinal surfaces. FIG. 6C illustrates a longitudinal view of the resonator of FIG. 6A with a first electrical connector 118 attached to the inside surface of the hole 112 at the first end 114. This resonator is typical for the implementation of the resonator 62 within FIG. 4. For this implementation, the longitudinal outside surfaces, the inside surfaces of the hole 112, and possibly the second end 116 would have a layer of conductive material added, normally the conductive material being a metal such as copper or silver. The first electrical connector 118 could preferably be attached to the ceramic dielectric material via the conductive material layer on the inside surface of the hole 112 near the first end 114.

A modification, according to embodiments of the present invention as depicted in FIG. 6D, that is made to a standard ceramic coaxial resonator, such as the resonator 62 within FIG. 4, is the addition of a second electrical connector 120 at the second end surface 116. The first and second electrical connectors 118, 120 are necessary to connect the resonator 92 to the capacitors 64 within the respective first and second oscillators of FIGS. 5A and 5B. This second electrical connector 120 is preferably connected to the ceramic dielectric material in a similar manner as the first electrical connector 118 but via the conductive material layer on the inside surface of the hole 112 near the second end 116. Alternatively, another technique is used to attach the first and/or second electrical connectors such as soldering. It is noted that electrical connectors could be conductive tabs or further another component that makes it possible for the resonator 92 to be part of an oscillator on either end 114, 116.

Although the ceramic coaxial resonator depicted within FIGS. 6A through 6D is in the shape of a rectangular prism and the hole 112 is depicted as circular, these characteristics are not meant to limit the scope of the present invention. The resonator can be of a different shape that still properly resonates as long as the opposite ends of the resonator are capable of being coupled to negative resistance cells. For instance, the resonator could be a cylindrical prism and/or have no hole but simply a conductive link between the opposite ends of the resonator. Yet further, the use of ceramic dielectric material within the coaxial resonator is not meant to limit the scope of the present invention. Another dielectric material could replace the ceramic material, though currently ceramic material is preferred due to the better performance characteristics.

Figure 7A:
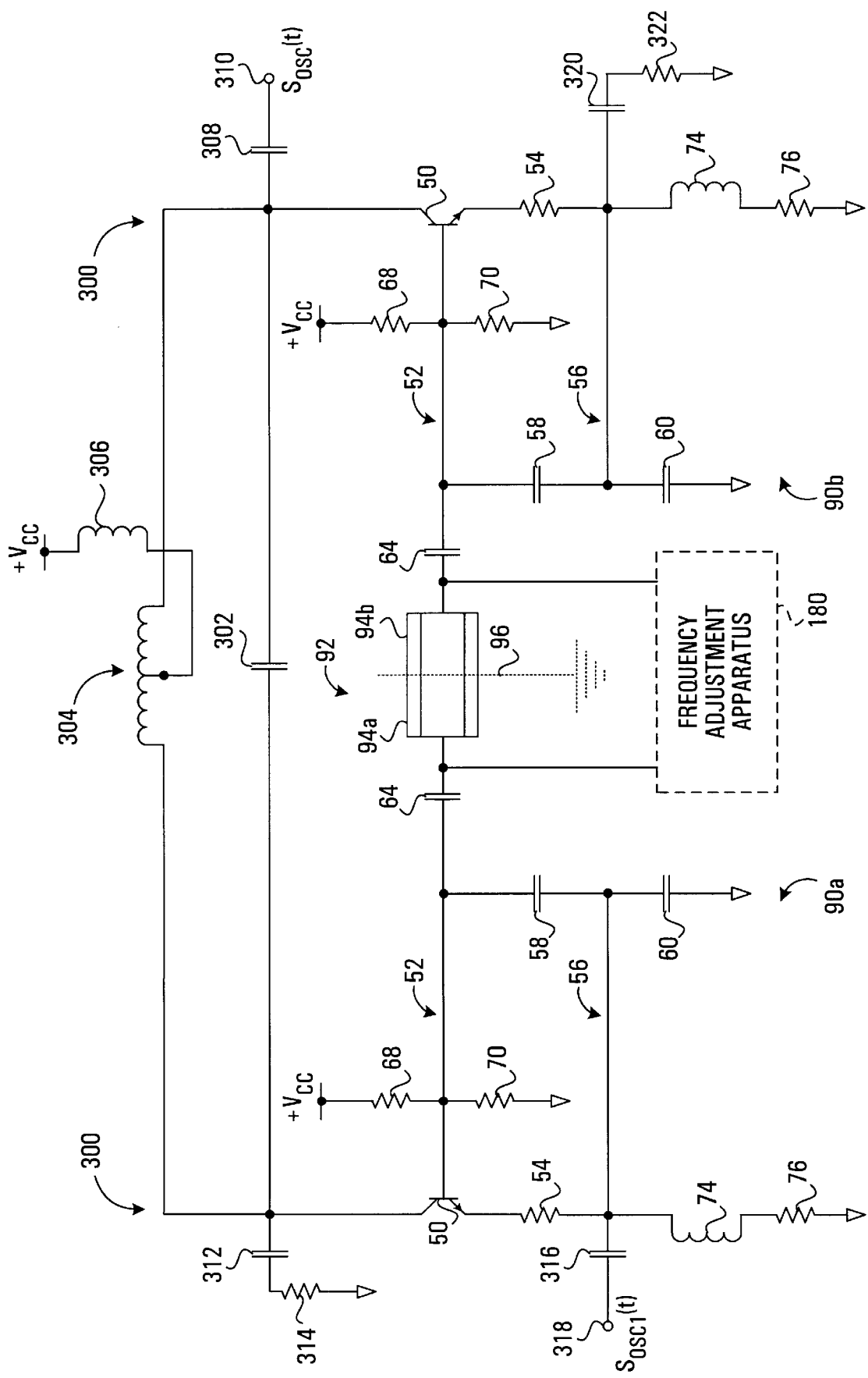
FIGS. 7A, 7B, 7C, 7D and 7E are schematic diagrams illustrating six possible implementations of a push-pull oscillator according to the present invention.

A push-pull oscillator design according to the present invention that utilizes the ceramic coaxial resonator of FIG. 6D is depicted within FIG. 7A. This design comprises two balanced negative resistance cells 90a, 90b, similar to those described herein above with reference to FIG. 5A. These cells 90a, 90b operate with the resonator 92 as first and second oscillators that are out-of-phase by approximately 180°. The key difference between the implementations of FIGS. 5A and 7A is the outputting of the oscillation signals from the overall oscillator. As can be seen in FIG. 7A, the resistors 53, capacitors 72, coupling capacitors 78, and outputting terminals 80 have been removed within the balanced negative resistance cells 90a, 90b. In place of these devices, the collectors 300 corresponding to the transistors 50 within FIG. 7A have been coupled via a tuning capacitor 302 coupled in parallel with a resonant load inductor 304. These components 302, 304 could be implemented in many manners including with distributed elements to cater for microwave frequency operation of the circuit. Coupled between the center of the resonant load inductor 304 and the power rail is a Radio Frequency (RF) choke inductor 306 that generates a virtual ground in the center of inductor 304 during operation. Further, as depicted in FIG. 7A, an output terminal 310 is coupled via a coupling capacitor 308 to the collector 300 of one of the transistors 50, the output signal at output terminal 310 being labelled $S_{OSC}$ (t).

Effectively, the single output at the output terminal 310 of FIG. 7A is a combination of the oscillation signals from the first and second oscillators that are out-of-phase by approximately 180°. In one embodiment of the present invention, the output signal $S_{OSC}$ (t) is designed to operate at a frequency six times the frequency of oscillation of the well-known oscillator of FIG. 4. Although the present invention should not be limited to this case, this particular implementation is now described for example.

In this implementation, the negative resistance cells 90a, 90b are tuned to twice the typical self resonant frequency generated with the single resonator 92. The capacitor 302 and resonant load inductor 304 are tuned to six times this typical self resonant frequency. As described previously, the design of the negative resistance cells 90a, 90b in this case result in oscillation signals at collectors 300 twice the normal frequency that could traditionally be achieved from the physical dimensions of resonator 92. The design of the capacitor 302 and the inductor 304 with the negative resistance cells 90a, 90b as depicted in FIG. 7A, which is commonly called a push-pull configuration as mentioned above, results in the overall oscillator to operate within the differential mode. In the differential mode, the signals at the collectors 300 are combined in a differential manner. Since the even harmonics of the signals at the collectors 300 are in-phase, no current flows in the collector resonator and hence no power is generated in the even harmonics. Consequently, the differential nature of the design causes the even harmonics to be cancelled out. On the other hand, since the odd harmonics (including the fundamental) of the signals at the collectors 300 are out-of-phase, the differential nature of the design causes these harmonics to be reinforced. The frequency at which the tuning capacitor 302 and resonant load inductor 304 are tuned further reinforces the third harmonic (six times the typical self resonant frequency of the resonator 92, three times the oscillation frequency at the emitters of the transistors 50) and mitigates the first, fifth, seventh, etc harmonics. In other embodiments, it should be understood that the capacitor 302 and inductor 304 could be tuned to other odd harmonics, thus causing a different oscillation frequency at the output terminal 310.

Further within FIG. 7A, a load capacitor 312 and a load resistor 314 are coupled in series between ground and the collector 300 of the transistor 50 not coupled to the outputting terminal 310. These devices are utilized in some embodiments of the present invention in order to balance the load at the outputting terminal 310.

Yet further within FIG. 7A, a second output terminal 318 is coupled via a coupling capacitor 316 to node 56 within one of the negative resistance cells, the output signal at the second output terminal 318 being labelled as $S_{OSC1}$ (t). To balance the load of this second output terminal 318, a load capacitor 320 and a load resistor 314 are preferably coupled in series between ground and node 56 within the other of the negative resistance cells not coupled to the second outputting terminal 318. This second outputting terminal 318 is utilized for feedback purposes within the PLL-FS configuration as discussed above. The use of this lower frequency signal reduces the need for frequency dividers to reduce the frequency of the feedback signal to a level that can be input to a frequency limited PLL synthesizer chip.

Figure 7B:
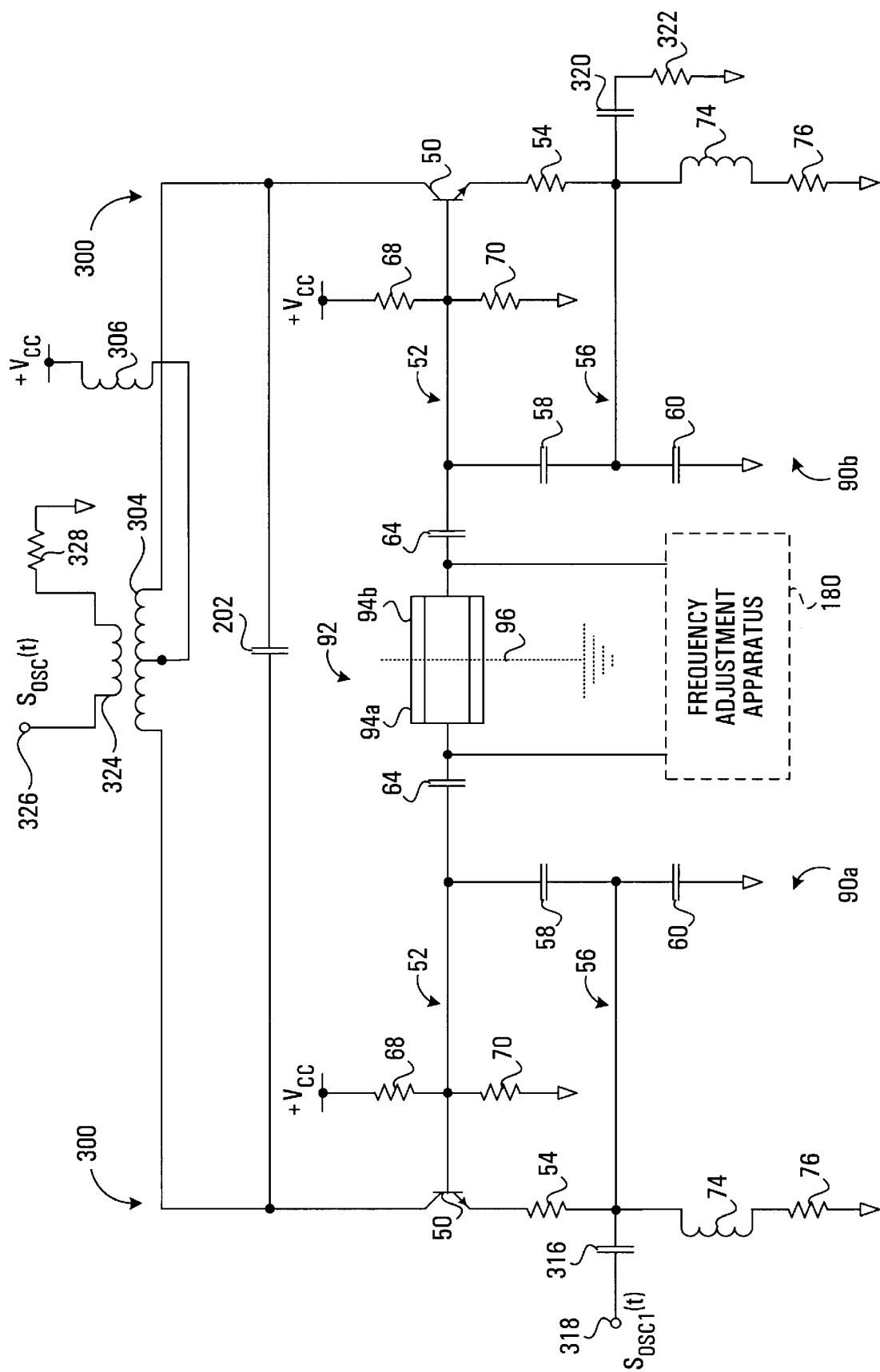

FIG. 7B illustrates another embodiment of an oscillator according to the present invention. In this embodiment, the output terminal 310 and the coupling capacitor 308 have been removed. Instead, as depicted in FIG. 7B, an inductor 324 is coupled between an output terminal 326 and a load 328 connected to ground, the inductor 324 acting as a transformer with inductor 304. In this case, the load 328, depicted as a resistor within FIG. 7B, is used to balance the load on the output terminal 326. The signal $S_{OSC}$ (t) at the output terminal 326 will be functionally the same as that at terminal 310 of FIG. 7A.

It should be noted that the components within FIGS. 7A and 7B that allow for the differential combination of the signals output from negative resistance cells 90a, 90b can be considered together to comprise a combination circuit. The combination circuit, as illustrated in FIGS. 7A and 7B, are coupled to the collectors of transistors 50 and has an output terminal for output signal $S_{osc}$(t).

It is noted that although tuning capacitor 302 is depicted as a component within FIGS. 7A and 7B, in some embodiments no tuning capacitor 302 would be necessary due to parasitic capacitance that already exists within the circuit.

Figure 7C:
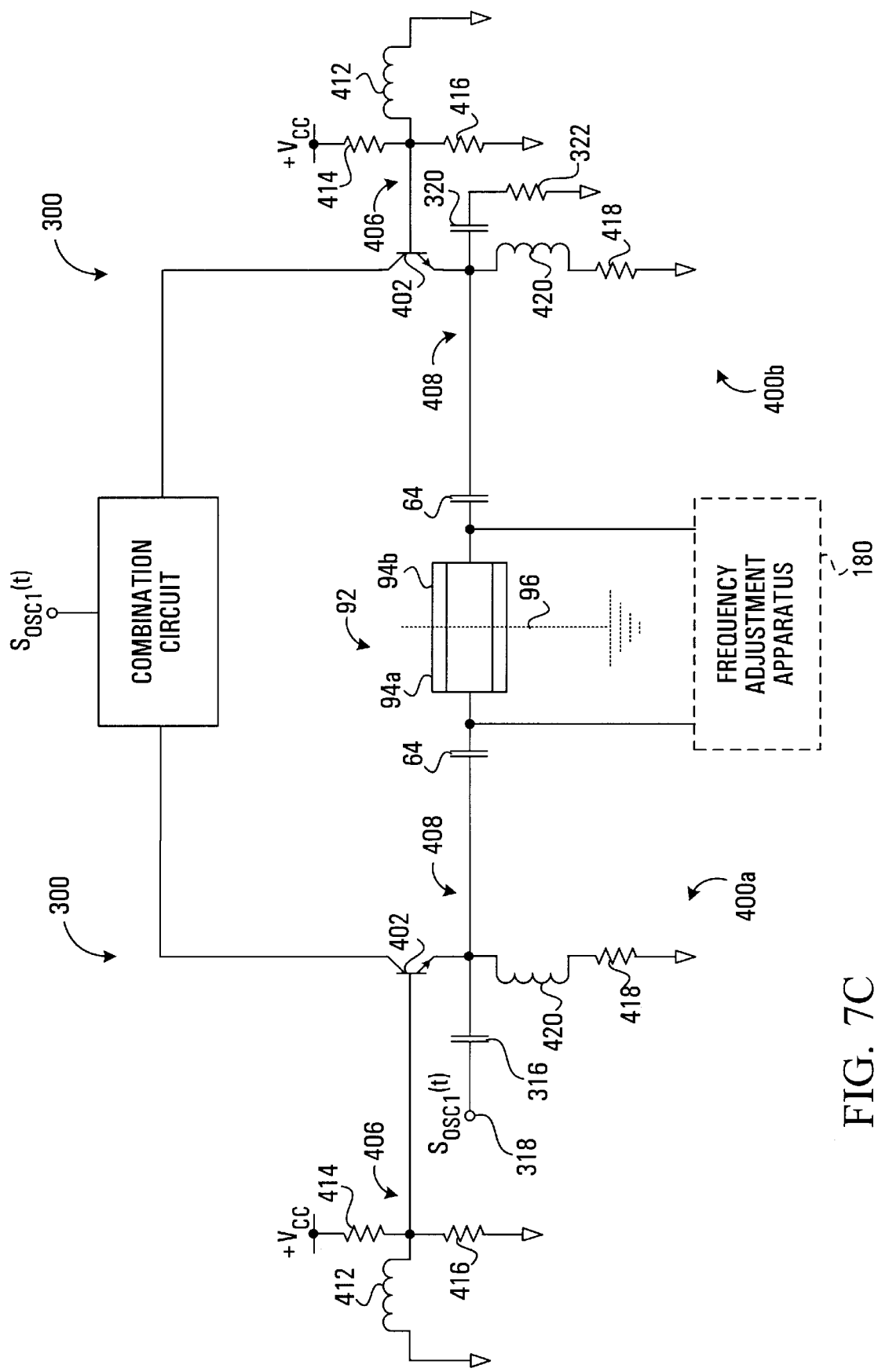

Further, although oscillator implementations described above are with respect to negative resistance cells of a Colpitts type, alternatively other negative resistance cells could be used. There are many well-known apparatuses that function as negative resistance cells in operation that can be coupled to either side of a coaxial resonator to generate an oscillator. For example, FIG. 7C illustrates the push-pull architecture of FIGS. 7A and 7B with the negative resistance cells of the Colpitts type replaced with alternative negative resistance cells 400a, 400b. In this case, each of the negative resistance cells 400a, 400b comprise a transistor 402 with a collector coupled to its respective node 400, a base coupled to a node 406 and an emitter coupled to a node 408. The nodes 408 are each further coupled to a respective end of the resonator 92 via coupling capacitor 64. The nodes 406 are each further coupled to an inductor 412 coupled between the node 406 and ground, a first biasing resistor 414 coupled between the node 406 and the power rail, and a second biasing resistor 416 coupled between the node 406 and ground. The emitter biasing in these negative resistance cells 400a, 400b is achieved through respective resistors 418 which are isolated from the RF circuit by respective choke inductors 420 in series. The remaining components depicted in FIG. 7C have previously been described herein above with reference to other implementations. The overall operation of the push-pull oscillator depicted in FIG. 7C is similar to the designs of FIG. 7A and 7B but with a different configuration for the balanced negative resistance cells. The end result is similar, that being an oscillation frequency at the output terminal six times the typical self resonant frequency generated with the single resonator 92 when in a set-up as depicted in FIG. 4.

Figure 7D:
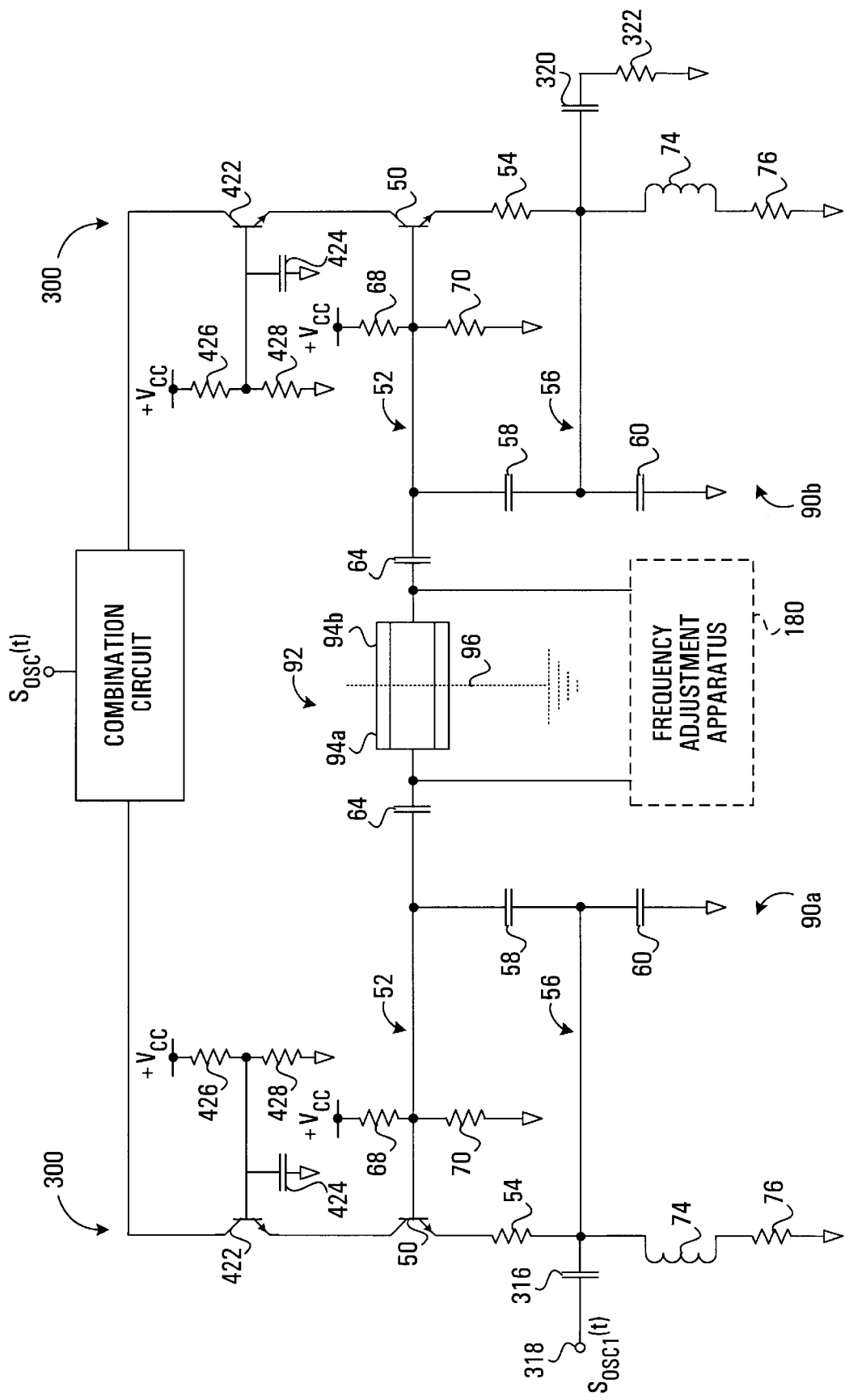
Figure 7E:
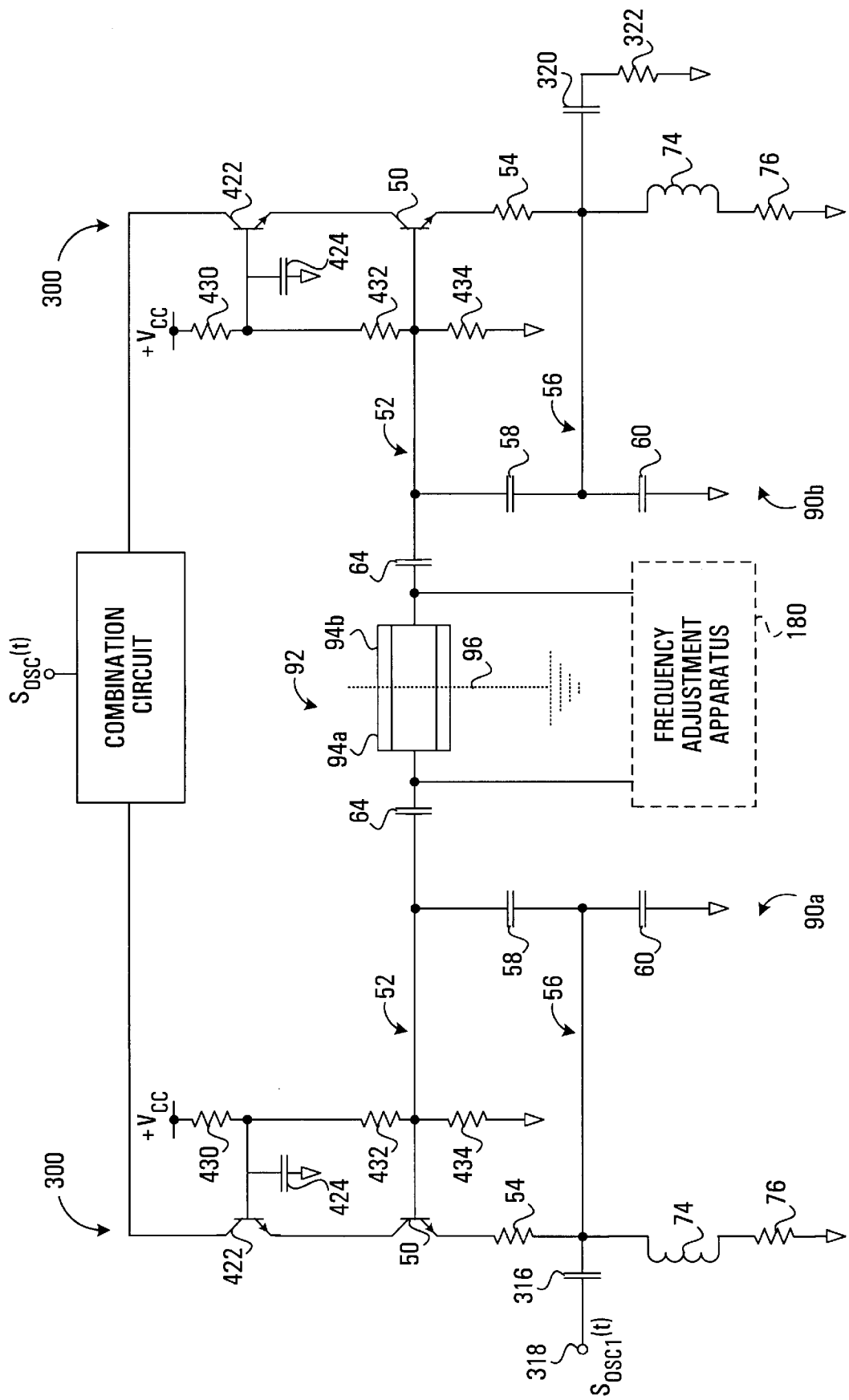
Figure 8:
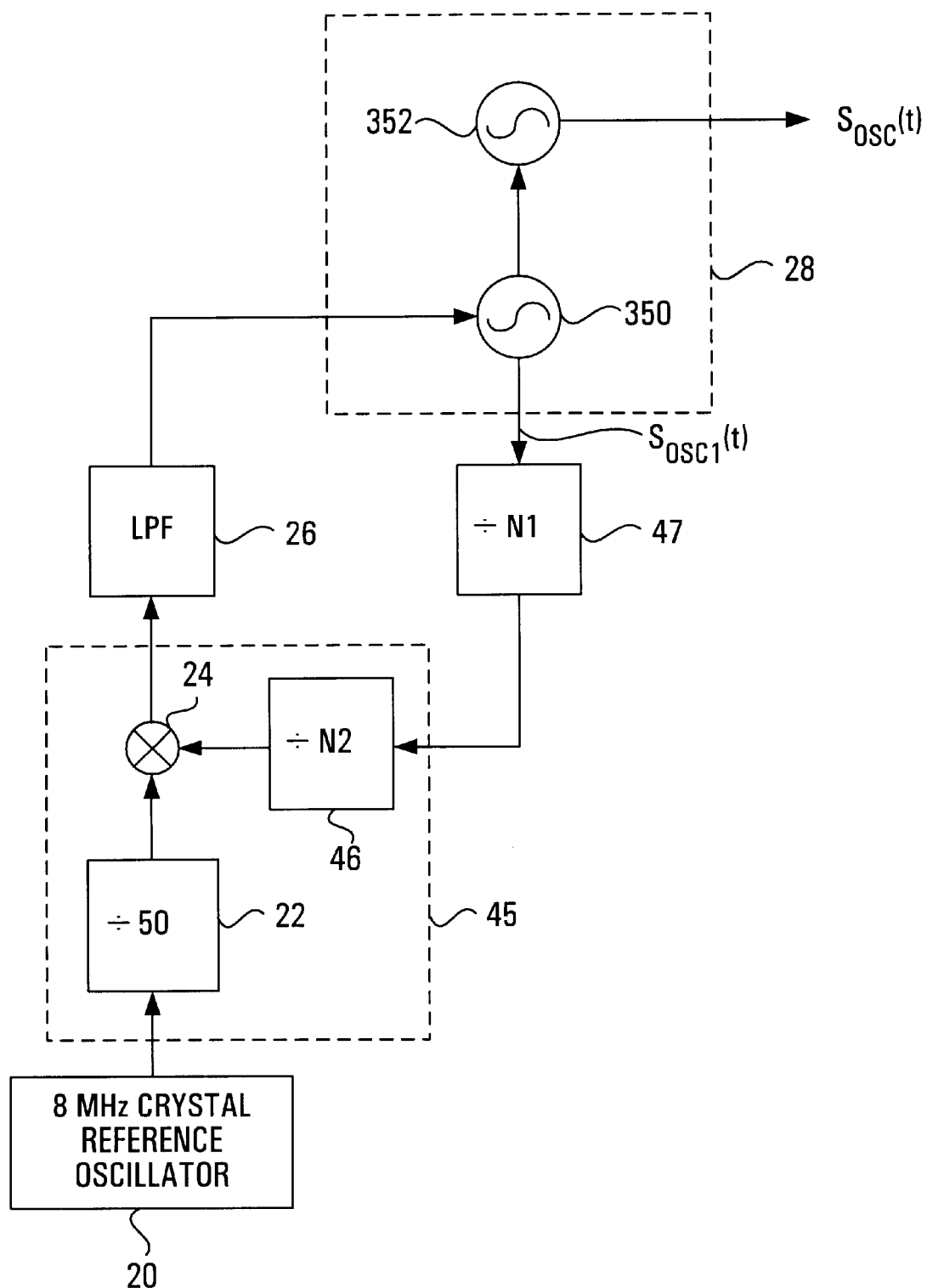
FIG. 8 is a block diagram illustrating the push-pull oscillator of one of FIGS. 7A through 7D being implemented within a PLL-FS configuration, with the PLL synthesizer chip depicted.

Although not illustrated within FIGS. 7A through 7C, in some embodiments components are implemented between the negative resistance cells and the combination circuit. For instance, it may be necessary in some embodiments to add resistors between the collectors of transistors 50/302 and the node coupled to the capacitor 302 and inductor 304 in order to suppress parasitic oscillations and therefore increase stability of the circuit. In other embodiments, cascode apparatus similar to those described above with reference to FIG. 5B could be implemented between the negative resistance cells and the combination circuit. FIGS. 7D and 7E illustrate two possible implementations of the present invention that include cascode apparatus. Within FIG. 7D, each of the cascode apparatus comprise a transistor 422 with its emitter coupled to the collector of the respective transistor 50 and its collector coupled to the respective node 300. Further, the base of each of the transistors 422 is coupled to a grounded capacitor 424, a first biasing resistor 426 coupled between the respective base and the power rail and a second biasing resistor coupled between the respective base and ground. Within FIG. 7E, the cascode apparatus is identical to that of FIG. 7D but with the biasing resistors 426, 428 being shared with biasing resistors 68, 70 within the negative resistance cells 90a, 90b. In this case, these biasing resistors 68, 70, 416, 428 have been replaced with first, second and third biasing resistors 430, 432, 434 coupled in series between the power rail and ground, As depicted within FIG. 7E, the node between the first and second biasing resistors 430, 432 is coupled to the base of transistor 422 while the node between the second and third biasing resistors 432, 434 is coupled to node 52. It should be understood that further implementations with cascode apparatus within the scope of the present invention. For example, the cascode apparatus could be implemented with negative resistance cells 400a, 400b as described above with reference to FIG. 7C.

Figure 9:
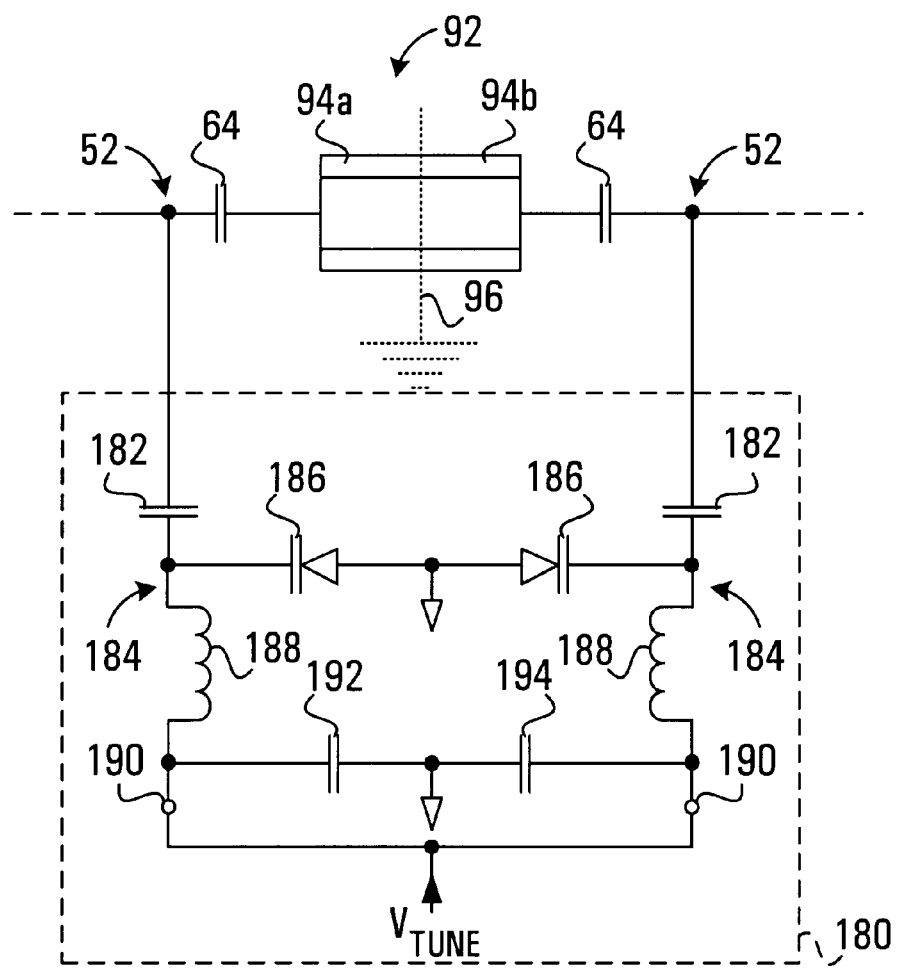
FIG. 9 is a schematic diagram illustrating an alternative implementation to the frequency adjustment apparatus illustrated in FIGS. 5A, 5B and 7A through 7D.

It should be understood that alternative implementations for the frequency adjustment apparatus 180 could be contemplated to the specific embodiment described herein above. For instance, as depicted within FIG. 9, the frequency adjustment apparatus 180 could be coupled to nodes 52 within FIGS. 7A, 7B, 7D, 7E (nodes 308 within FIG. 7C) rather than the nodes between the resonator 92 and the coupling capacitors 64. The advantage of this modification is the reduced parasitic capacitance that is applied to the resonator 92. By having the frequency adjustment apparatus coupled to nodes 52, capacitors 182 are coupled in series with respective coupling capacitors 64 rather being coupled in parallel. This change allows for the resonator 92 to increase the actual frequency that is achieved.

It should be noted that the described alternative to the frequency adjustment apparatus could also apply to other oscillation designs such as that depicted in FIGS. 5A and 5B or to the push-push oscillation designs described within U.S. patent application Ser. No. 09/409989 entitled "Coaxial Resonators and Oscillation Circuits Featuring Coaxial Resonators", filed on Sep. 30, 1999 by the inventors of the present application, assigned to the assignee of the present application and herein incorporated by reference.

The VCOs described above with reference to FIGS. 5A, 5B, and 7A through 7E generate higher frequency signals than typical VCOs using ceramic coaxial resonators of similar dimensions. These higher frequency signals can reduce the need for frequency multiplication stages after the VCO while still allowing the use of ceramic coaxial resonators. Unfortunately, one key problem that must be considered, as discussed above, is the need for frequency dividers to reduce the frequency of the feedback signal to a level that can be input to a frequency limited PLL synthesizer chip.

Figure 3:
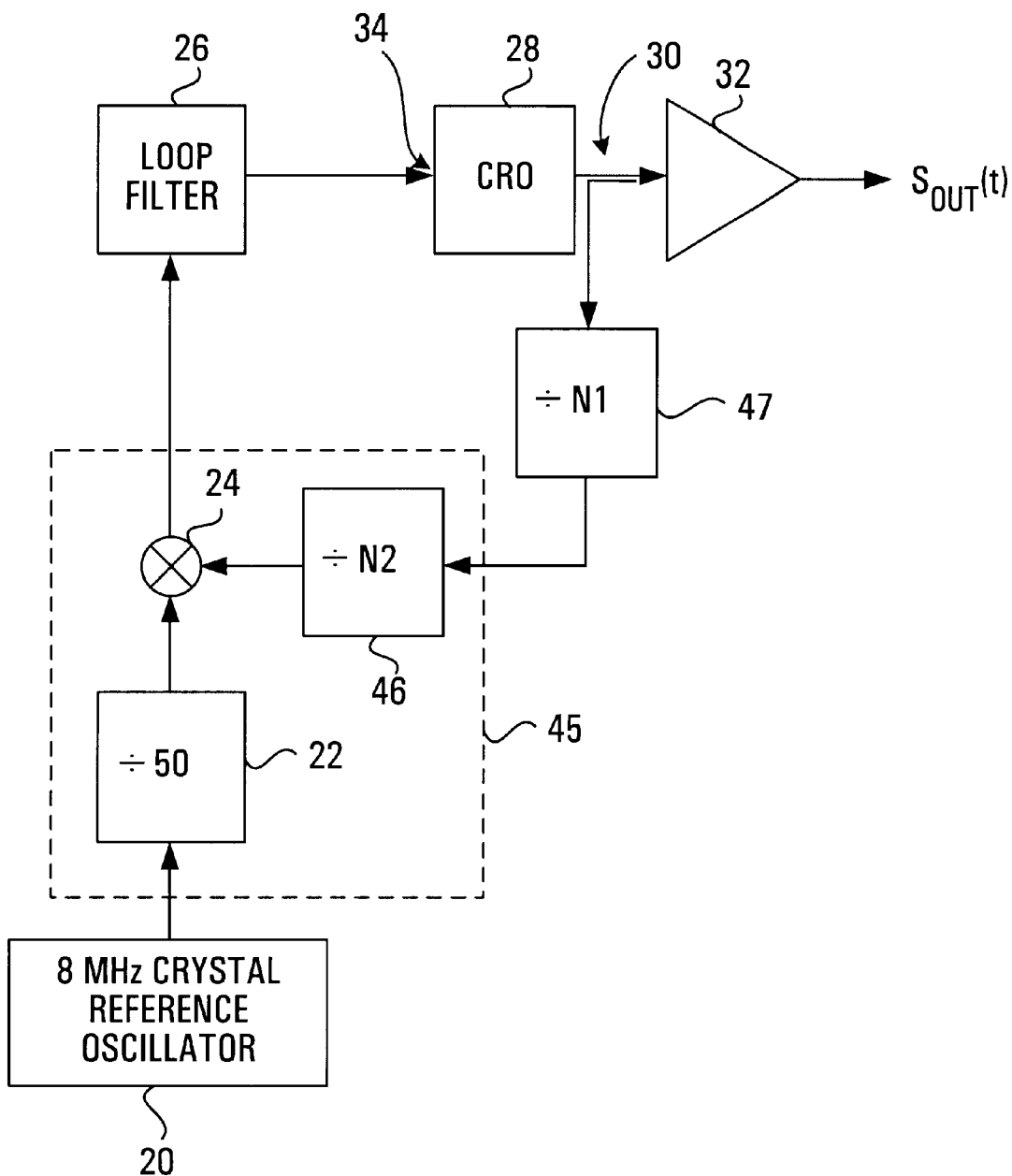
FIG. 3 is a block diagram illustrating the PLL-FS configuration of FIG. 1 but with the composition of a PLL synthesizer chip depicted.

This problem can be mitigated with the sampling of the first output signal $S_{OCS1}$ (t) within the push-pull oscillation design of one of FIGS. 7A through 7E. FIG. 10 is a block diagram illustrating the PLL-PS of FIG. 3 in the case that the VC-CRO 28 is a push-pull oscillator that samples the second output signal $S_{OSC1}$ (t) as well as the overall oscillation signal $S_{OSC}$ (t). As shown in FIG. 10, the VC-CRO 28 logically comprises a first oscillator 350 that generates a signal $S_{OSC1}$ (t) at a first frequency and a second oscillator 352 that generates a signal $S_{OSC}$ (t) at a second frequency that is three times that of the first frequency. Hence, the level of frequency division required within the external frequency divider 47 in this situation is reduced by three compared to the case that the full frequency signal $S_{OSC}$ (t) was used for feedback purposes. This reduction in the frequency division can result in simpler external dividers which in turn can reduce the phase noise, cost and physical size resulting from such devices. In some particular cases, the use of the above described technique for the push-pull oscillator designs can result in the removal of the need for the external frequency divider 47 altogether, depending upon the design characteristics required and the operating parameters of the PLL synthesizer chip 45.

An advantage of the present invention is the possibility of increasing an oscillation frequency beyond the physical limitation commonly thought for a ceramic coaxial resonator while still utilizing a ceramic coaxial resonator. If utilized within a push-pull oscillation design, according to the present invention, and the system further has a subharmonically pumped mixer for doubling the frequency, the present invention can increase the range of use for a VC-CRO from approximately 5 GHz to approximately 60 GHz (5×2×3×2). It should be noted that if the resonators are operated as inductors, the actual frequency of oscillation will be slightly lower than the self resonant frequencies of the resonator.

This expansion in frequency allows future radio applications beyond LMDS (approximately 26-40 GHz) to achieve the required frequency while still using the advantageous ceramic coaxial resonators. All of the advantages of the ceramic coaxial resonators as described herein above are advantages of the present invention. In terms of the LMDS applications, the DRO at a present cost of approximately $500–600 can be replaced with a push-pull oscillator as depicted in any one of FIGS. 7A through 7D at a cost less than $20, assuming a subharmonically pumped mixer or doubler is implemented within the system.

Figure 2:
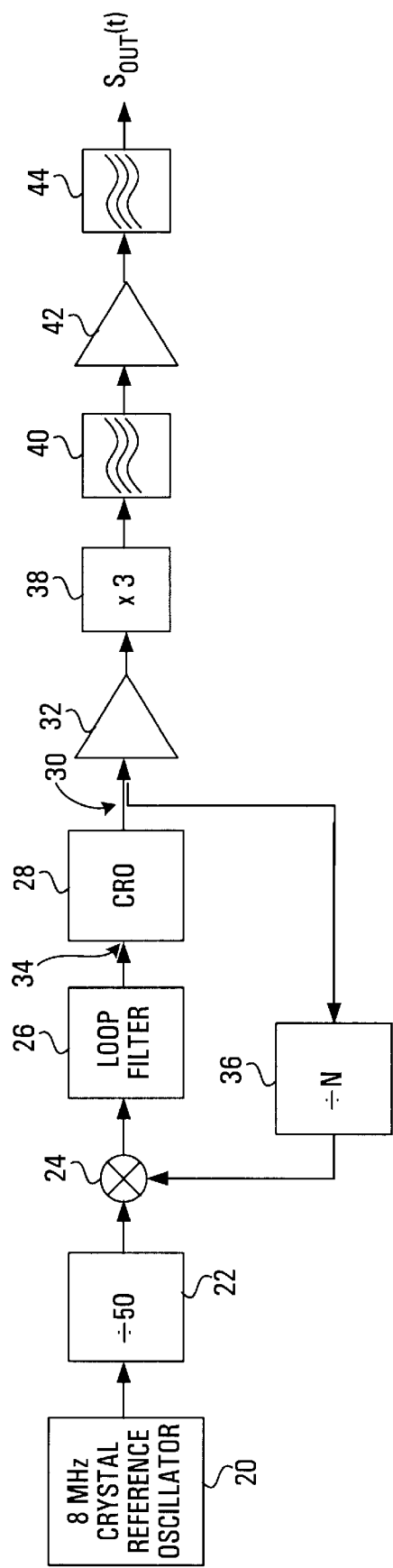
FIG. 2 is a block diagram illustrating the well-known PLL-FS configuration of FIG. 1 with an additional frequency multiplication stage.

Even if the increase in frequency resulting from an implementation of the present invention does not remove the need for a frequency multiplication stage such as that illustrated in FIG. 2, there can still be advantages if the frequency multiplication factor required is reduced. This is generally because the conversion efficiency of a multiplication stage is typically one over the multiplication factor. Further, there are two commonly used techniques for implementing multipliers with varying disadvantages. For multiplication stages that require only a doubling of frequency, a relatively low phase noise Schottky Barrier diode can be used while if large frequency multiplication operations are needed, step recovery diodes are typically needed which increase the overall phase noise for the PLL-FS. In this case of a step recovery diode being used as a multiplication stage, a plurality of the harmonics within the voltage pulse chain generated by the step recovery diode are "picked off" by a tuned circuit in order to increase the frequency.

A further advantage of the embodiments of the present invention depicted in FIGS. 7A through 7E results from the low frequency signal that can be sampled for feedback. The reduction in the minimum frequency that can be sampled from the oscillator design can, as discussed previously, reduce the need for external dividers within a PLL-FS implementation, and hence reduce the phase noise, cost and physical size that are associated with such external frequency dividers. Although preferably the external dividers are removed from PLL-PS according to embodiments of the present invention, it is noted that in other embodiments such dividers are still used with the division factor reduced.

It should be understood that although the present invention can be utilized by a system using a ceramic coaxial resonator to raise the oscillation frequency to levels above 30 GHz, the present invention can also be utilized in implementations requiring lower frequencies. The present invention does not have to be operated with the minimum size ceramic coaxial resonator or with any other frequency doubling techniques. There are possible advantages of the present invention even at these lower frequencies when compared to other oscillator designs. For instance, there are advantages to using larger resonators within the oscillator designs of FIGS. 7A through 7E rather than using a resonator a sixth the size within a standard CRO as depicted in FIG. 4. The resonator Q factor can be increased by using a physically larger sized resonator that can store an increased amount of energy, thus subsequently causing reductions in phase noise.

A yet further advantage of the balanced oscillator configuration of the present invention is its reduced phase noise compared to a single oscillator configuration such as that depicted in FIG. 4. This decrease in phase noise is partially due to the output power of the balanced oscillator configuration being increased by 6 dB over the single oscillator configuration. Further, the use of the balanced oscillator configuration compared to using two uncorrelated oscillators has been shown to lead to an additional 3 dB decrease in the phase noise. Consequently, the balanced oscillator has an improved phase noise of approximately 9 dB.

The embodiments of the present invention were described as VC-CROs. It should be recognized that with the removal of the frequency adjustment apparatus 180 within FIGS. 7A through 7E, the oscillator is simply a CRO with no voltage control.

Persons skilled in the art will appreciate that there are yet more alternative implementations and modifications possible for implementing the present invention, and that the above implementation is only an illustration of this embodiment of the invention. The scope of the invention, therefore, is only to be limited by the claims appended hereto.

We claim:
1. An oscillation circuit comprising:
a coaxial resonator;
first and second negative resistance cells, coupled to first and second ends of the coaxial resonator respectively, that are out-of-phase by a phase angle approximately 180 degrees and that generate respective first and second oscillation signals at a frequency approximately equal to a self resonant frequency associated with another coaxial resonator half the size of the coaxial resonator; and a combination circuit, coupled to each of the first and second negative resistance cells, that operates in differential mode to combine the first and second oscillation signals in order to generate an output oscillation signal.

2. An oscillation circuit according to claim 1, wherein the combination circuit is tuned to an odd harmonic of the oscillation frequency of the first and second oscillation signals so as to mitigate the other odd harmonics within the output oscillation signal.

3. An oscillation circuit according to claim 2, wherein the combination circuit is tuned to the third harmonic of the oscillation frequency of the first and second oscillation signals;

whereby the output oscillation signal has an oscillation frequency approximately three times that of the first and second oscillation signals.

4. An oscillation circuit according to claim 1, wherein the combination circuit comprises a resonant load inductor and a tuning capacitor coupled in parallel between first and second nodes that receive the first and second oscillation signals respectively from the first and second negative resistance cells respectively; and wherein the combination circuit further comprises a Radio Frequency (RF) choke inductor coupled between the center of the resonant load inductor and a power rail 5. An oscillation circuit according to claim 4, wherein the combination circuit further comprises an output terminal coupled via a coupling capacitor to one of the first and second nodes and a load circuit coupled to the other one of the first and second nodes not coupled to the output terminal.

6. An oscillation circuit according to claim 5, wherein the load circuit comprises a load capacitor and a load resistor coupled in series between ground and the other one of the first and second nodes not coupled to the output terminal.

7. An oscillation circuit according to claim 4, wherein the combination circuit further comprises a transformer inductor coupled electro-magnetically to the resonant load inductor and further coupled between an output terminal and a load circuit connect ed to ground, the load circuit being of equivalent impedance to that seen at the output terminal.

8. An oscillation circuit according to claim 4, wherein the resonant load inductor and tuning capacitor are tuned to the third harmonic of the oscillation frequency of the first and second oscillation signals;

whereby the output oscillation signal has an oscillation frequency approximately three times that of the first and second oscillation signals.

9. An oscillation circuit according to claim 4, wherein the tuning capacitor comprises parasitic capacitance of the circuit and does not comprise a physical component.

10. An oscillation circuit according to claim 4, wherein the resonant load inductor and the tuning capacitor are implemented as at least one distributed element.

11. An oscillation circuit according to claim 1 further comprising first and second cascode apparatus coupled between the combination circuit and respective ones of the first and second negative resistance cells.

12. An oscillation circuit according to claim 11, wherein the first and second cascode apparatus each comprise a transistor with a base, emitter and collector, a grounded capacitor coupled between the base and ground and a biasing voltage circuit coupled to the base, the emitters of the transistors each being coupled to its respective negative resistance cell and the collectors of the transistors each being coupled to the combination circuit.

13. An oscillation circuit according to claim 12, wherein the biasing voltage circuit within each cascode apparatus comprises a first biasing resistor coupled between the base of the respective transistor and a power rail and a second biasing resistor coupled between the base of the respective transistor and ground.

14. An oscillation circuit according to claim 1, wherein the first and second negative resistance cells are of a Colpitts type.

15. An oscillation circuit according to claim 14, wherein the first and second negative resistance cells each comprise a transistor with a base, emitter and collector, a first feedback capacitor coupled between the base and emitter, and a second capacitor coupled between the emitter and ground, the bases of the transistors each further being coupled to a respective end of the coaxial resonator and the collectors each being coupled to the combination circuit.

16. An oscillation circuit according to claim 15, wherein the first and second feedback capacitors within each negative resistance cell are coupled to the respective emitter via an emitter resistor;

wherein each of the negative resistance cells further comprises a first biasing resistor coupled between the power rail and its respective base, a second biasing resistor coupled between ground and its respective base, and a dc bias resistor coupled in series with a choke inductor, the dc bias resistor and the choke inductor further coupled between their respective emitter and ground; and wherein the first and second biasing resistors operate to generate biasing voltages at their respective bases, the dc bias resistors operate to generate dc bias voltages at their respective emitters, and the choke inductors operate to open circuit their respective dc bias resistors within an RF spectrum.

17. An oscillation circuit according to claim 15 further comprising first and second cascode apparatus coupled between the combination circuit and the collectors of respective ones of the transistors within the negative resistance cells.

18. An oscillation circuit according to claim 17, wherein the first and second cascode apparatus each comprise a transistor with a base, emitter and collector, a grounded capacitor coupled between the base and ground and a biasing voltage circuit coupled to the base, the emitters of the transistors each being coupled to collectors of the transistor within its respective negative resistance cell and the collectors of the transistors each being coupled to the combination circuit.

19. An oscillation circuit according to claim 18, wherein each of the negative resistance cells further comprises a biasing voltage circuit coupled to the base of its respective transistor; and wherein each of the biasing voltage circuits within the cascode apparatus and the biasing voltage circuit within the respective negative resistance cell together comprise a single biasing voltage circuit that generates at least two biasing voltages, one that is input to the base of the transistor within the cascode apparatus and one that is input to the base of the transistor within the negative resistance cell.

20. An oscillator according to claim 11, wherein the first and second negative resistance cells each comprise a transistor with a base, an emitter and a collector, and an inductor coupled between the base and ground, the emitters of the transistors further being coupled to a respective end of the coaxial resonator and the collectors of the transistors being coupled to the combination circuit.

21. An oscillation circuit according to claim 20, wherein each of the negative resistance cells further comprises a first biasing resistor coupled between the power rail and its respective base, a second biasing resistor coupled between ground and its respective base, and a dc bias resistor coupled in series with a choke inductor, the dc bias resistor and the choke inductor further coupled between their respective emitter and ground; and wherein the first and second biasing resistors operate to generate biasing voltages at their respective bases, the dc bias resistors operate to generate dc bias voltages at their respective emitters, and the choke inductors operate to open circuit their respective dc bias resistors within an RF spectrum.

22. An oscillation circuit according to claim 20 further comprising first and second cascode apparatus coupled between the combination circuit and the collectors of respective ones of the transistors within the negative resistance cells.

23. An oscillation circuit according to claim 22, wherein the first and second cascode apparatus each comprise a transistor with a base, emitter and collector, a grounded capacitor coupled between the base and ground and a biasing voltage circuit coupled to the base, the emitters of the transistors each being coupled to collectors of the transistor within its respective negative resistance cell and the collectors of the transistors each being coupled to the combination circuit.

24. An oscillation circuit according to claim 23, wherein each of the negative resistance cells further comprises a biasing voltage circuit coupled to the base of its respective transistor; and wherein each of the biasing voltage circuits within the cascode apparatus and the biasing voltage circuit within the respective negative resistance cell together comprise a single biasing voltage circuit that generates at least two biasing voltages, one that is input to the base of the transistor within the cascode apparatus and one that is input to the base of the transistor within the negative resistance cell.

25. An oscillation circuit according to claim 1, wherein the first and second ends of the coaxial resonator are coupled to the respective negative resistance cells via coupling capacitors.

26. An oscillation circuit according to claim 1, wherein one of the first and second oscillation signals is output from the oscillation circuit along with the output oscillation signal.

27. An oscillation circuit according to claim 1 further comprising a frequency adjustment apparatus independently coupled to both the first and second ends of the coaxial resonator, the frequency adjustment apparatus operating to receive a tuning signal and to adjust the load being applied to the coaxial resonator.

28. An oscillation circuit according to claim 27, wherein the first and second ends of the coaxial resonator are coupled to the respective negative resistance cells via resonator coupling capacitors; and wherein the first and second ends of the coaxial resonator are coupled to the frequency adjustment apparatus via the resonator coupling capacitors.

29. An oscillation circuit according to claim 27, wherein the frequency adjustment apparatus operates with use of a varactor diode.

30. A Phase Locked Loop-Frequency Synthesizer (PLL-FS), incorporating an oscillation circuit according to claim 27, comprising:

a crystal resonant oscillator that generates a first oscillation signal;

a Phase Locked Loop (PLL) synthesizer component, coupled to the crystal resonant oscillator, that receives the first oscillation signal and a feedback oscillation signal, and generates an error signal;

a loop filter, coupled to the PLL synthesizer component, that receives and filters the error signal leaving only the baseband signal within a filtered signal; and the oscillation circuit, coupled to the loop filter, that receives the filtered signal as the tuning signal, outputs the output oscillation signal and further outputs one of the first and second oscillation signals as the feedback oscillation signal.

31. A PLL-FS according to claim 30 further comprising an amplifier, coupled to the oscillation circuit, that receives the output oscillation signal and amplifies it to generate an amplified output signal for the PLL-FS.

32. A Phase Locked Loop-Frequency Synthesizer (PLL-FS), incorporating an oscillation circuit according to claim 27, comprising:

a crystal resonant oscillator that generates a first oscillation signal;

a Phase Locked Loop (PLL) synthesizer component, coupled to the crystal resonant oscillator, that receives the first oscillation signal and a feedback oscillation signal, and generates an error signal;

a loop filter, coupled to the PLL synthesizer component, that receives and filters the error signal leaving only the baseband signal within a filtered signal;

the oscillation circuit, coupled to the loop filter, that receives the filtered signal as the tuning signal and outputs the output oscillation signal and one of the first and second oscillation signals; and a frequency divider, coupled between the oscillation circuit and the PLL synthesizer component, that receives said one of the first and second oscillation signals and reduces its frequency Lo generate the feedback oscillation signal.

33. A PLL-FS according to claim 32 further comprising an amplifier, coupled to the oscillation circuit, that receives the output oscillation signal and amplifies it to generate an amplified output signal for the PLL-FS.

34. An oscillation circuit comprising:

a coaxial resonator with first and second electrical connectors coupled at respective first and second opposite ends of the coaxial resonator;

first and second coupling capacitors coupled between the first and second electrical connectors respectively and first and second coupling nodes respectively;

first and second negative resistance cells, coupled to the first and second coupling nodes respectively, that are out-of-phase by a phase angle approximately 180 degrees; and a frequency adjustment apparatus, coupled to each of the first and second coupling nodes, that in operation receives a tuning signal and adjusts the load being applied to the coaxial resonator.

35. An oscillation circuit according to claim 34, wherein the frequency adjustment apparatus operates with use of a varactor diode.

* * * * *